United States Patent
Honda et al.

(10) Patent No.: US 9,240,313 B2
(45) Date of Patent: Jan. 19, 2016

(54) TARGET FOR ULTRAVIOLET LIGHT GENERATION, ELECTRON BEAM-EXCITED ULTRAVIOLET LIGHT SOURCE, AND PRODUCTION METHOD FOR TARGET FOR ULTRAVIOLET LIGHT GENERATION

(71) Applicant: HAMAMATSU PHOTONICS K.K., Hamamatsu-shi, Shizuoka (JP)

(72) Inventors: Yoshinori Honda, Hamamatsu (JP); Hiroyuki Taketomi, Hamamatsu (JP); Fumitsugu Fukuyo, Hamamatus (JP); Koji Kawai, Hamamatsu (JP); Hidetsugu Takaoka, Hamamatsu (JP); Norio Ichikawa, Hamamatsu (JP); Takashi Suzuki, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/437,376

(22) PCT Filed: Sep. 6, 2013

(86) PCT No.: PCT/JP2013/074129
§ 371 (c)(1),
(2) Date: Apr. 21, 2015

(87) PCT Pub. No.: WO2014/065028
PCT Pub. Date: May 1, 2014

(65) Prior Publication Data
US 2015/0294853 A1    Oct. 15, 2015

(30) Foreign Application Priority Data

Oct. 23, 2012    (JP) ................................. 2012-233973

(51) Int. Cl.
C23C 16/40    (2006.01)
H01J 63/06    (2006.01)

(52) U.S. Cl.
CPC ........ H01J 63/06 (2013.01); C23C 16/40 (2013.01)

(58) Field of Classification Search
CPC .................................. C23C 16/40; H01J 63/06
See application file for complete search history.

(56) References Cited

U.S. PATENT DOCUMENTS

| | | | | |
|---|---|---|---|---|
| 2008/0191607 A1* | 8/2008 | Kawai | .................. | C09K 11/54 313/503 |
| 2012/0161104 A1* | 6/2012 | Okamoto | .............. | C09K 11/64 257/13 |

FOREIGN PATENT DOCUMENTS

| | | |
|---|---|---|
| CN | 1893976 | 1/2007 |
| CN | 101084329 | 12/2007 |

(Continued)

OTHER PUBLICATIONS

L. Pidol et al., "Scintillation properties of $Lu_2Si_2O_7:Ce^{3+}$, a fast and efficient scintillator crystal", J. Phys.: Condens. Matter 15, 2003, p. 2091-p. 2102.

(Continued)

*Primary Examiner* — Mark R Gaworecki
(74) *Attorney, Agent, or Firm* — Drinker Biddle & Reath LLP

(57) ABSTRACT

A target for ultraviolet light generation comprises a substrate adapted to transmit ultraviolet light therethrough and a light-emitting layer disposed on the substrate and generating ultraviolet light in response to an electron beam. The light-emitting layer includes a polycrystalline film constituted by an oxide polycrystal containing Lu and Si doped with an activator or a polycrystalline film constituted by a rare-earth-containing aluminum garnet polycrystal doped with an activator.

18 Claims, 26 Drawing Sheets

(56) References Cited

FOREIGN PATENT DOCUMENTS

| | | |
|---|---|---|
| CN | 101842869 | 9/2010 |
| JP | H02-225587 A | 9/1990 |
| JP | 2002-057388 A | 2/2002 |
| JP | 2006-520836 A | 9/2006 |
| JP | 2007-077280 | 3/2007 |
| JP | 2008-231218 A | 10/2008 |
| JP | 2010-024278 A | 2/2010 |
| JP | 2010-222403 A | 10/2010 |
| JP | 2012-229306 A | 11/2012 |
| WO | WO-2006/049284 A1 | 5/2006 |

OTHER PUBLICATIONS

International Preliminary Report on Patentability mailed May 7, 2015 for PCT/JP2013/074129.

Zorenko, Y., et al., "Luminescence Centers in $Y_3Al_5O_{12}$:La Single Crystals," Journal of Phyiscs: Conference Series, vol. 289, No. 1, Oct. 30, 2011, pp. 1-7.

\* cited by examiner

Fig.3

| Base material | Activator | Light emission peak wavelength [nm] |
|---|---|---|
| LuAG ($Lu_3Al_5O_{12}$) | La | 265 |
| | Sc | 265 |
| | Bi | 297 |
| YAG ($Y_3Al_5O_{12}$) | La | 297 |
| | Sc | — |

(a)

(b)

(a)

(b)

(a)

(b)

(c)

(a)

(b)

(a)

(b)

TARGET FOR ULTRAVIOLET LIGHT GENERATION, ELECTRON BEAM-EXCITED ULTRAVIOLET LIGHT SOURCE, AND PRODUCTION METHOD FOR TARGET FOR ULTRAVIOLET LIGHT GENERATION

TECHNICAL FIELD

One aspect of the present invention relates to a target for ultraviolet light generation, an electron-beam-excited ultraviolet light source, and a method for manufacturing a target for ultraviolet light generation.

BACKGROUND ART

Patent Literature 1 describes the use of a single crystal containing praseodymium (Pr) as a material for a scintillator employed in PET devices. Patent Literature 2 discloses a technique concerning an illumination system in which a wavelength of light emitted from a light-emitting diode is converted by a phosphor so as to attain white light.

CITATION LIST

Patent Literature

Patent Literature 1: International Publication No. 2006/049284 pamphlet
Patent Literature 2: Japanese Translated International Application Laid-Open No. 2006-520836

SUMMARY OF INVENTION

Technical Problem

Electron tubes such as mercury-xenon lamps and deuterium lamps have conventionally been used as ultraviolet light sources. However, these ultraviolet light sources are low in light emission efficiency and large in size and have problems in terms of stability and life. On the other hand, electron-beam-excited ultraviolet light sources equipped with a structure for exciting ultraviolet light by irradiating a target with an electron beam have been known as another type of ultraviolet light sources. The electron-beam-excited ultraviolet light sources are expected to become light sources in the field of optical measurement taking advantage of their high stability, for sterilization and disinfection making use of their low power consumption, or for medical care and biochemistry utilizing their high wavelength selectivity. The electron-beam-excited ultraviolet light sources also have a merit that their power consumption is lower than that of mercury lamps and the like.

Light-emitting diodes which can output light in the ultraviolet region such as one having a wavelength of 360 nm or shorter have recently been developed. However, such light-emitting diodes still have low output light intensity and are hard to increase their light-emitting area, thus leaving a problem that their uses are limited. By contrast, the electron-beam-excited ultraviolet light sources can generate ultraviolet light with sufficient intensity and are able to output ultraviolet light having uniform intensity with a large area by increasing the diameter of the electron beam irradiating the target.

However, the electron-beam-excited ultraviolet light sources are also demanded to improve their ultraviolet light generation efficiency further. It is an object of one aspect of the present invention to provide a target for ultraviolet light generation, an electron-beam-excited ultraviolet light source, and a method for manufacturing a target for ultraviolet light generation, which can enhance the ultraviolet light generation efficiency.

Solution to Problem

For solving the problems mentioned above, a first target for ultraviolet light generation in accordance with one aspect of the present invention comprises a substrate adapted to transmit ultraviolet light therethrough and a light-emitting layer disposed on the substrate and generating ultraviolet light in response to an electron beam, the light-emitting layer including a polycrystalline film constituted by an oxide polycrystal containing Lu and Si doped with an activator. A second target for ultraviolet light generation in accordance with one aspect of the present invention comprises a substrate adapted to transmit ultraviolet light therethrough and a light-emitting layer disposed on the substrate and generating ultraviolet light in response to an electron beam, the light-emitting layer including a polycrystalline film constituted by a rare-earth-containing aluminum garnet polycrystal doped with an activator, the polycrystalline film having an ultraviolet light emission peak wavelength of 300 nm or shorter.

The inventors thought of using an oxide crystal containing Lu and Si doped with an activator (such as LPS and LSO) or a rare-earth-containing aluminum garnet crystal doped with an activator (such as LuAG and YAG) as a target for ultraviolet light generation. However, it has turned out that using single crystals such as those described in the prior art literature is hard to yield sufficient ultraviolet light generation efficiency. When polycrystals are used in a substrate form as they are, on the other hand, their thickness lowers transmittance for ultraviolet light and increases manufacturing cost.

In contrast, as a result of tests and studies conducted by the inventors, it has been found that forming the above-mentioned oxide crystal or rare-earth-containing aluminum garnet crystal as a polycrystalline film on the ultraviolet-light-transmissive substrate can remarkably enhance the ultraviolet light emission efficiency while suppressing the manufacturing cost. That is, the first target for ultraviolet light generation in accordance with one aspect of the present invention can effectively enhance the ultraviolet light emission efficiency as compared with the case of single crystals, since its light-emitting layer contains a polycrystalline film constituted by an oxide polycrystal containing Lu and Si doped with an activator. Similarly, the second target for ultraviolet light generation in accordance with one aspect of the present invention can effectively enhance the ultraviolet light emission efficiency as compared with the case of single crystals, since its light-emitting layer contains a polycrystalline film constituted by a rare-earth-containing aluminum garnet polycrystal doped with an activator. The first and second targets for ultraviolet light generation can suppress the manufacturing cost and enhance the transmittance for ultraviolet light as compared with the case using a polycrystalline substrate, since the oxide crystal or rare-earth-containing aluminum garnet crystal is formed as a polycrystalline film on the ultraviolet-light-transmissive substrate.

In the above-mentioned first target for ultraviolet light generation, the oxide polycrystal may include at least one of $Lu_2Si_2O_7$ (LPS) and $Lu_2SiO_5$ (LSO). In this case, the activator may be Pr.

In the above-mentioned second target for ultraviolet light generation, the rare-earth-containing aluminum garnet polycrystal may be $Lu_3Al_5O_{12}$ (LuAG), the activator being at least one of Sc, La, and Bi. In the second target for ultraviolet light generation, the rare-earth-containing aluminum garnet polycrystal may also be $Y_3Al_5O_{12}$ (YAG), the activator being at least one of Sc and La.

In the first and second targets for ultraviolet light generation, the polycrystalline film may have a thickness of at least 0.1 μm but not more than 10 μm. According to tests and studies conducted by the inventors, the thickness of the polycrystalline film may be at least 0.1 μm in order for electron beams to contribute to light emission without passing therethrough and may be 10 μm or less from the viewpoint of productivity. The polycrystalline film having such a thickness can enhance the ultraviolet light emission more effectively.

In the first and second targets for ultraviolet light generation, the substrate may be constituted by sapphire, silica, or rock crystal. This enables the substrate to transmit ultraviolet light therethrough and endure the temperature of heat treatment of the light-emitting layer.

The electron-beam-excited ultraviolet light source in accordance with one aspect of the present invention comprises any of the targets for ultraviolet light generation mentioned above and an electron source providing the target with the electron beam. This electron-beam-excited ultraviolet light source can enhance the ultraviolet light generation efficiency while suppressing the manufacturing cost by having any of the targets for ultraviolet light generation mentioned above.

A first method for manufacturing a target for ultraviolet light generation in accordance with one aspect of the present invention comprises a first step of vapor-depositing an activator and an oxide containing Lu and Si on a substrate adapted to transmit ultraviolet light therethrough, so as to form a film, and a second step of turning the film into a polycrystal by heat treatment. A second method for manufacturing a target for ultraviolet light generation in accordance with one aspect of the present invention comprises a first step of vapor-depositing an activator having an ultraviolet light emission peak wavelength of 300 nm or shorter and a material for a rare-earth-containing aluminum garnet crystal, so as to form a film, and a second step of turning the film into a polycrystal by heat treatment.

The first step forms an amorphous film on an ultraviolet-light-transmissive substrate. However, the amorphous film hardly excites ultraviolet light even when irradiated with electron beams. Heat-treating (annealing) the amorphous film in the second step as in these manufacturing methods can turn the amorphous film into a polycrystal. That is, the above-mentioned first manufacturing method can favorably manufacture a target for ultraviolet light generation comprising a polycrystalline film constituted by an oxide polycrystal containing Lu and Si doped with an activator. The above-mentioned second manufacturing method can also favorably manufacture a target for ultraviolet light generation comprising a polycrystalline film constituted by a rare-earth-containing aluminum garnet crystal doped with an activator. In each of the above-mentioned manufacturing methods, the first and second steps may be performed concurrently.

In the above-mentioned first and second methods for manufacturing a target for ultraviolet light generation, the film may have a thickness of at least 0.1 μm but not more than 10 μm after the heat treatment in the second step. This can more effectively enhance the ultraviolet light emission efficiency. In the above-mentioned first method for manufacturing a target for ultraviolet light generation, the surroundings of the film may be at an atmospheric pressure during the heat treatment in the second step. In the above-mentioned second method for manufacturing a target for ultraviolet light generation, the surroundings of the film may be in a vacuum.

Advantageous Effects of Invention

The target for ultraviolet light generation, electron-beam-excited ultraviolet light source, and method for manufacturing a target for ultraviolet light generation in accordance with one aspect of the present invention can enhance the ultraviolet light generation efficiency.

BRIEF DESCRIPTION OF DRAWINGS

FIG. 3 is a chart listing specific examples of a rare-earth-containing aluminum garnet crystal doped with an activator, which is usable in a light-emitting layer 22 of the embodiment;

DESCRIPTION OF EMBODIMENTS

In the following, embodiments of the target for ultraviolet light generation, electron-beam-excited ultraviolet light source, and method for manufacturing a target for ultraviolet light generation in accordance with one aspect of the present invention will be explained in detail with reference to the drawings. In the explanation of the drawings, the same constituents will be referred to with the same signs while omitting their overlapping descriptions.

Figure 1:
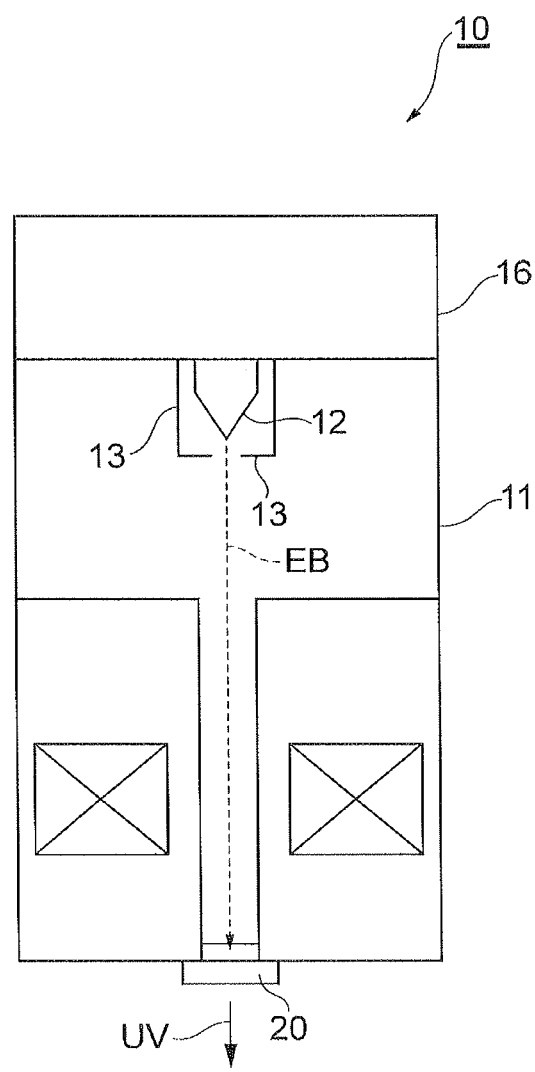
FIG. 1 is a schematic view illustrating an inner structure of the electron-beam-excited ultraviolet light source in accordance with an embodiment.

FIG. 1 is a schematic view illustrating an inner structure of an electron-beam-excited ultraviolet light source 10 in accordance with an embodiment. In this electron-beam-excited ultraviolet light source 10, as illustrated in FIG. 1, an electron source 12 and an extraction electrode 13 are arranged on the upper end side within a glass envelope (electron tube) 11 evacuated under vacuum. When an appropriate extraction voltage is applied between the electron source 12 and extraction electrode 13 from a power supply part 16, an electron beam EB accelerated by a high voltage is emitted from the electron source 12. As the electron source 12, one emitting an electron beam having a large area (e.g., cold cathodes such as carbon nanotubes or hot cathodes) can be used.

A target 20 for ultraviolet light generation is arranged on the lower end side within the envelope 11. The target 20 is set to the ground potential, for example, while a high negative voltage is applied from the power supply part 16 to the electron source 12. As a consequence, the target 20 is irradiated with the electron beam EB emitted from the electron source 12. The target 20 is excited in response to the electron beam EB and generates ultraviolet light UV.

Figure 2:
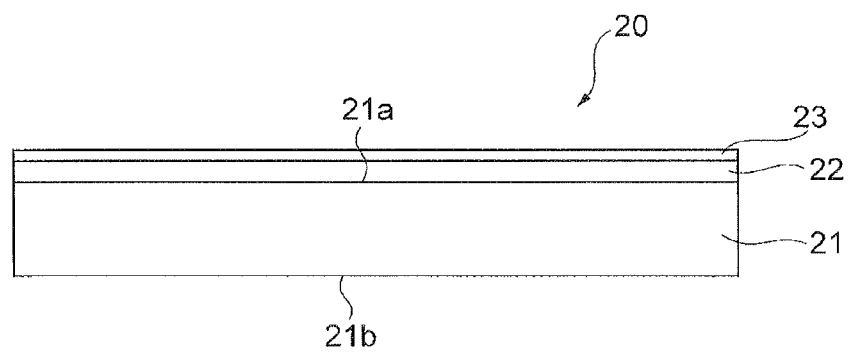
FIG. 2 is a side view illustrating a structure of a target for ultraviolet light generation.

FIG. 2 is a side view illustrating a structure of the target 20. As illustrated in FIG. 2, the target 20 comprises a substrate 21, a light-emitting layer 22 disposed on the substrate 21, and an aluminum film 23. The substrate 21 is a planar member made of a material adapted to transmit ultraviolet light therethrough, an example of which is constituted by sapphire ($Al_2O_3$), silica ($SiO_2$), or rock crystal (crystal of silicon oxide). The substrate 21 has a principal surface 21a and a rear face 21b. A preferred thickness of the substrate 21 is at least 0.1 mm but not more than 10 mm.

The light-emitting layer 22 is excited in response to the electron beam EB illustrated in FIG. 1 and generates the ultraviolet light UV. In one example, the light-emitting layer 22 includes a polycrystalline film formed by turning an oxide containing Lu and Si doped with an activator into a polycrystal. Preferred examples of such an oxide polycrystal include $Lu_2Si_2O_7$ (LPS) and $Lu_2SiO_5$ (LSO) polycrystals doped with a rare-earth element (Pr in an example) serving as an activator. Different kinds of the oxide crystal (e.g., LPS and LSO) may be mixed. A preferred thickness of the polycrystalline film is at least 0.1 μm but not more than 10 μm. A preferred activator content is at least 0.001 atom % but not more than 10 atom %.

In another example, the light-emitting layer 22 includes a polycrystalline film formed by turning a rare-earth-containing aluminum garnet doped with an activator into a polycrystal. Preferred examples of the rare-earth-containing aluminum garnet include $Lu_3Al_5O_{12}$ (LuAG) and $Y_3Al_5O_{12}$ (YAG). Rare-earth elements are preferred as the activator. At least one of scandium (Sc), lanthanum (La), and bismuth (Bi) is preferred as the activator when the rare-earth-containing aluminum garnet crystal is LuAG. At least one of Sc and La is preferred as the activator when the rare-earth-containing aluminum garnet crystal is YAG. This polycrystalline film has an ultraviolet light emission peak wavelength of 300 μm or shorter. As will be seen from examples to be explained later, a preferred thickness of the polycrystalline film is at least 0.1 μm but not more than 10 μm. A preferred activator content is at least 0.001 atom % but not more than 10 atom %.

FIG. 3 is a chart listing specific examples of the rare-earth-containing aluminum garnet crystal doped with an activator which can be used in the light-emitting layer 22 of this embodiment. FIG. 3 illustrates ultraviolet light emission peak wavelengths (unit: nm) corresponding to combinations of activators and base materials. As illustrated in FIG. 3, examples of the rare-earth-containing aluminum garnet crystal doped with an activator include La:LuAG Sc:LuAG, Bi:LuAG, La:YAG, and Sc:YAG. Their light emission peak wavelengths are not longer than 300 nm and vary depending on the activator content.

In the light-emitting layer 22, different kinds of rare-earth-containing aluminum garnet crystals (e.g., LuAG and YAG) may be mixed, and different kinds of activators (e.g., at least two of La, Sc, and Bi) may be mixed.

Figure 4:
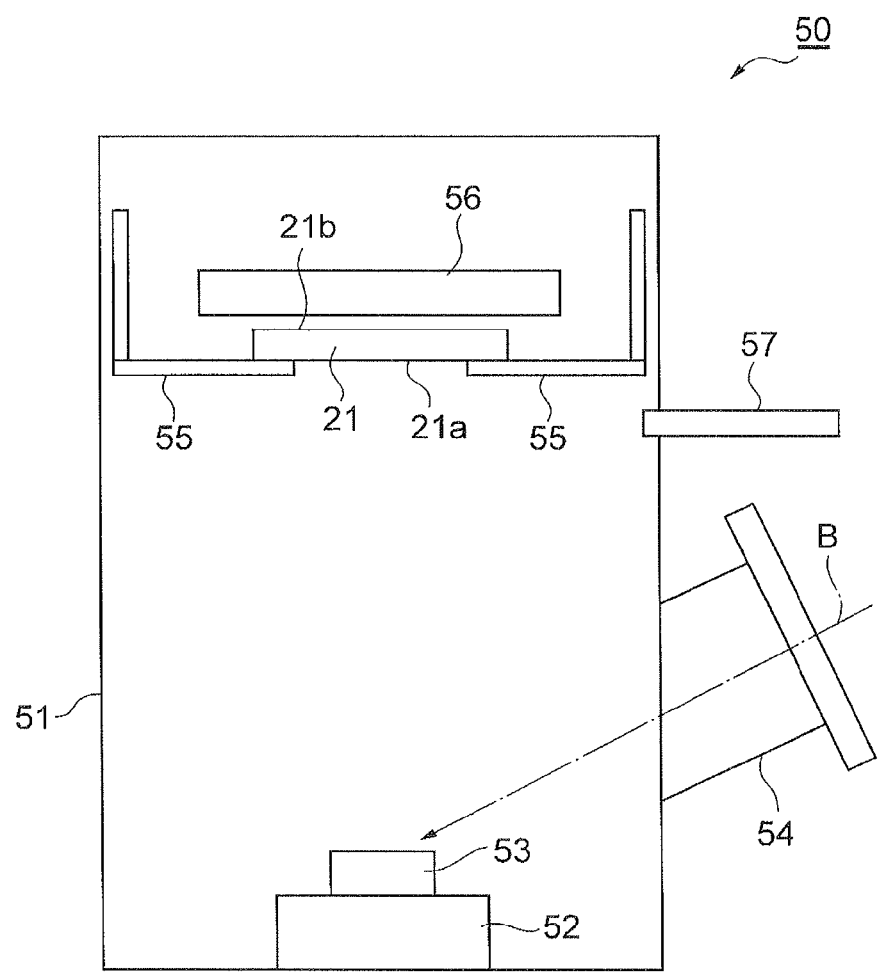
FIG. 4 is a schematic view illustrating a laser ablation device used for the manufacturing method.

A method for manufacturing the target 20 of this embodiment will now be explained. FIG. 4 is a schematic view illustrating a structure of a laser ablation device 50 used for this manufacturing method. The laser ablation device 50 illustrated in FIG. 4 comprises a vacuum container 51, a sample mount 52 arranged on the bottom face of the vacuum container 51, and a laser inlet 54. The laser inlet 54 introduces a laser beam B, with which a material 53 is irradiated, into the vacuum container 51. The material 53 is mounted on the sample mount 52. The laser inlet 54 is supplied with a laser beam (having a wavelength of 248 nm) from a KrF excimer laser, for example.

The laser ablation device 50 further comprises a rotary holder 55, a heater 56 for heating the substrate 21, and a gas inlet 57 for feeding an oxygen gas into the vacuum container 51. The rotary holder 55 supports the substrate 21 arranged above the material 53. The rotary holder 55 holds the substrate 21 rotatably about an axis connecting the material 53 and substrate 21, while exposing the principal surface 21a of the substrate 21 against the material 53.

Figure 5:
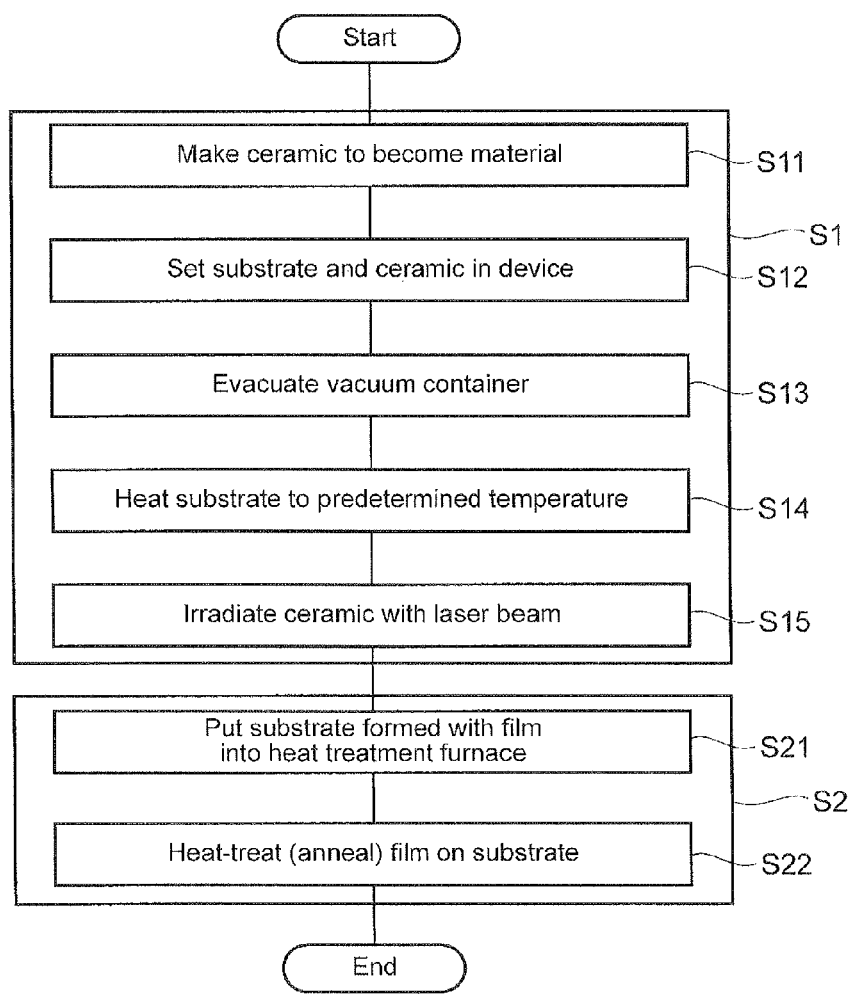
FIG. 5 is a flowchart illustrating a method for manufacturing a target for ultraviolet light generation.

FIG. 5 is a flowchart illustrating a method for manufacturing the target 20. First, an amorphous film is vapor-deposited on the substrate 21 (first step S1). Specifically, a ceramic including an oxide containing Lu and Si (e.g., LPS or LSO) and an activator (e.g., Pr) at a predetermined ratio is made as the material 53 at first. Alternatively, a ceramic including materials for a rare-earth-containing aluminum garnet crystal (e.g., LuAG or YAG) and an activator (e.g., Sc, La, or Bi) at a predetermined ratio is made as the material 53 (step S11). The rare-earth-containing aluminum garnet crystal doped with such an activator has an ultraviolet light emission peak wavelength of 300 nm or shorter.

Next, the substrate 21 is prepared and installed on the rotary holder 55 of the laser ablation device 50, while the material 53 made in the step S11 is mounted on the sample mount 52 (step S12). Subsequently, the vacuum container 51 is evacuated (step S13), and the heater 56 heats the substrate 21 to a predetermined temperature (e.g., 800° C.) (step S14). Thereafter, the material 53 is irradiated with the laser beam B while feeding the oxygen gas into the vacuum container 51 from the gas inlet 57 (step S15). As a consequence, the material 53 evaporates in response to the laser beam B and scatters within the vacuum container 51. A part of the scattered material 53 adheres to the principal surface 21a of the substrate 21, thereby forming an amorphous film.

Subsequently, the amorphous film formed on the principal surface 21a of the substrate 21 is heat-treated, so as to become a polycrystal (second step S2). Specifically, the substrate 21 having the amorphous film formed thereon is taken out of the laser ablation device 50 and put into a heat treatment furnace (step S21). Then, the temperature in the heat treatment furnace is set higher than 1000° C., for example, and this temperature is maintained for a predetermined time, so as to subject the amorphous film on the substrate 21 to heat treatment (annealing) (step S22). The heat-treated amorphous film becomes a polycrystal at this time.

Effects obtained by this embodiment will now be explained. As will be seen from examples to be explained later, it has been found out that forming an oxide crystal containing Lu and Si doped with an activator or a rare-earth-containing aluminum garnet crystal doped with an activator as a polycrystalline film on the substrate 21 adapted to transmit ultraviolet light therethrough can remarkably enhance the ultraviolet light emission efficiency while suppressing the manufacturing cost.

That is, since the light-emitting layer 22 includes a polycrystalline film constituted by an oxide polycrystal containing Lu and Si doped with an activator or a polycrystalline film constituted by a rare-earth-containing aluminum garnet doped with an activator, the target 20 in accordance with this embodiment can effectively enhance the ultraviolet light generation efficiency as compared with the case of single crystals. Further, since the above-mentioned polycrystalline film is formed on the ultraviolet-light-transmissive substrate 21, the target in accordance with this embodiment can suppress the manufacturing cost as compared with the case using the polycrystalline substrate and enhance the transmittance for ultraviolet light.

The substrate 21 is preferably made of sapphire, silica, or rock crystal as in this embodiment. This enables the substrate 21 to transmit ultraviolet light therethrough and the amorphous film to be heat-treated at high temperature in the step S22.

Preferably, the polycrystalline film of the light-emitting layer 22 has a thickness of at least 0.1 μm but not more than 10 μm as in this embodiment. As will be seen from examples to be explained later, the thickness of the polycrystalline film is preferably at least 0.1 μm in order for electron beams to contribute to light emission without passing therethrough and preferably 10 μm or less from the viewpoint of productivity. The polycrystalline film having such a thickness can enhance the ultraviolet light emission more effectively.

The manufacturing method of this embodiment vapor-deposits an amorphous film on the substrate 21 and then heat-treats the amorphous film. While the first step S1 forms an amorphous film on the substrate 21, ultraviolet light hardly occurs even when the amorphous film is irradiated with electron beams. By contrast, heat-treating the amorphous film in the second step can turn the amorphous film into a polycrystalline film, whereby a target for ultraviolet light generation which generates ultraviolet light with a high efficiency can be manufactured. The first and second steps S1 and S2 may be performed concurrently.

Examples concerning the above-mentioned embodiment will be explained in the following. The first to sixth examples to be explained in the following are examples concerning the case where the polycrystalline film of the light-emitting layer 22 is constituted by a Pr:LSO polycrystal. The facts found out from these examples seem to be the same in oxide polycrystals containing Lu and Si doped with an activator having the same characteristics as those of the Pr:LSO polycrystal, e.g., Pr:LPS polycrystal.

FIRST EXAMPLE

First, in this example, an LSO-containing ceramic including 0.5 atom % of Pr was made as the material 53. Subsequently, this Pr:LSO-containing ceramic was mounted on the sample mount 52 of the laser ablation device 50, while a sapphire substrate having a diameter of 2 inch was installed on the rotary holder 55. The distance between the Pr:LSO-containing ceramic and sapphire substrate was 150 mm. Thereafter, the vacuum container 51 was evacuated, and the sapphire substrate was heated to 500° C. Then, while feeding the oxygen gas into the vacuum container 51, the material 53 was irradiated with the laser beam B for 120 min, so as to make an amorphous film. At this time, a KrF excimer laser (150 mJ, 40 Hz) was used as a laser source for the laser beam B. Thereafter, the sapphire substrate was put into a heat treatment furnace, and the sapphire substrate and amorphous film were heated for 2 hr at 1200° C. in a vacuum ($10^{-2}$ Pa).

Figure 6:
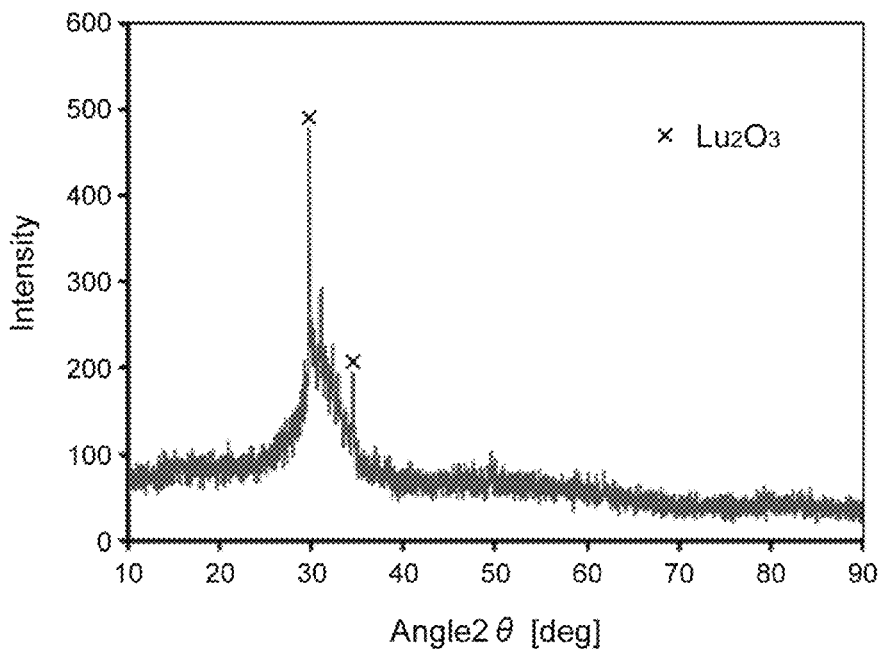
FIGS. 6(a) and 6(b) are graphs illustrating results of X-ray diffractometry of an amorphous film before and after heat treatment, respectively.
Figure 6:
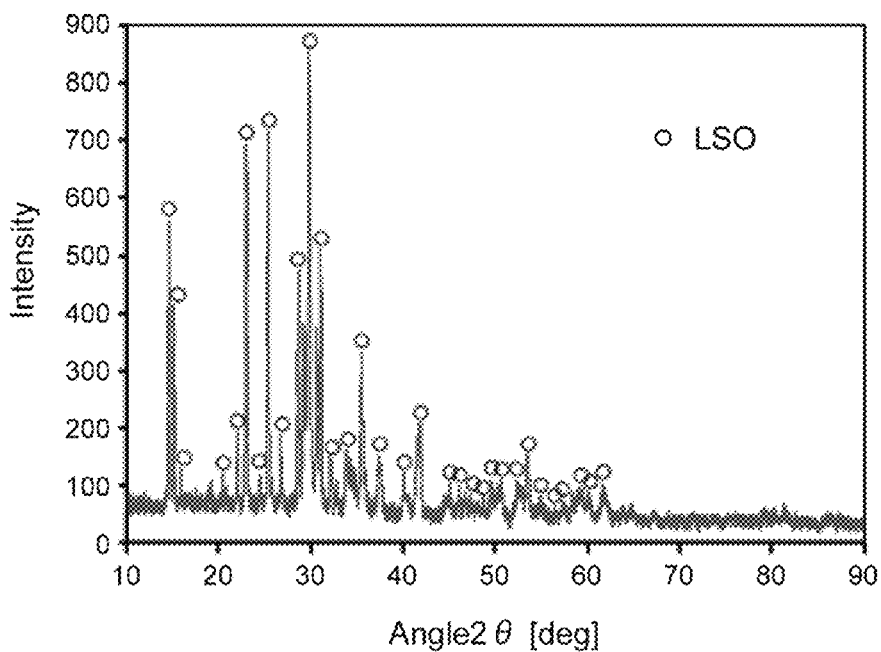

FIG. 6(a) is a graph illustrating results of X-ray diffractometry of the amorphous film before the heat treatment. FIG. 6(b) is a graph illustrating results of X-ray diffractometry of the film after the heat treatment. As illustrated by these graphs, while only diffraction lines deriving from $Lu_2O_3$ (indicated by crosses in the graph) and those with large half-widths were observed before the heat treatment, diffraction lines deriving from Pr:LSO crystals (indicated by circles in the graph) were observed after the heat treatment. It is seen from these graphs that the amorphous film has been changed into a Pr:LSO polycrystalline film by the heat treatment.

Figure 7:
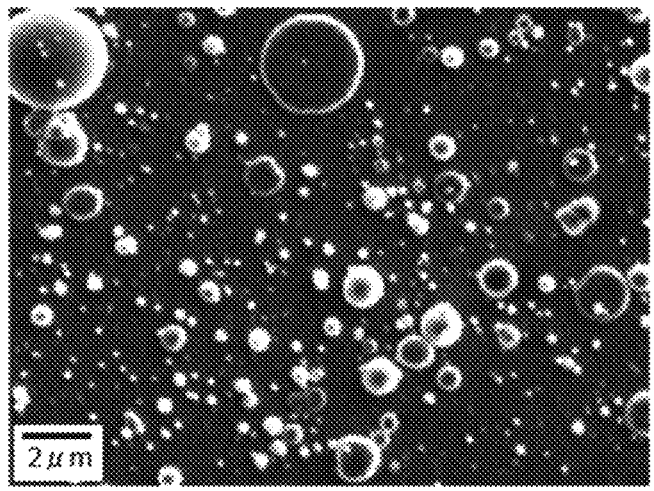
FIGS. 7(a) and 7(b) are SEM photographs concerning a surface of a Pr:LSO film before and after heat treatment, respectively.
Figure 7:
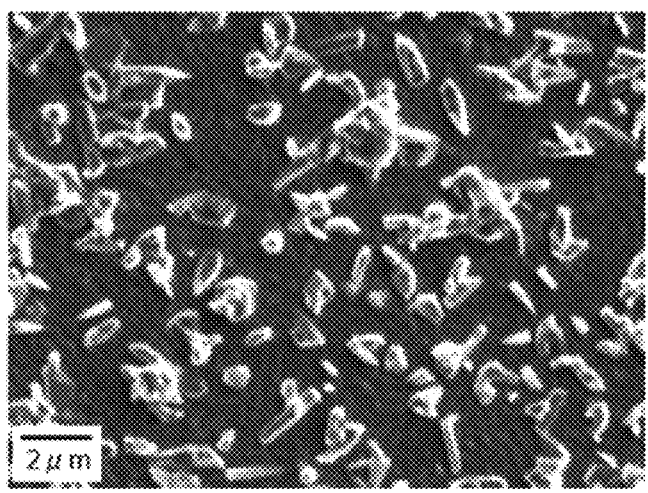

FIGS. 7(a) and 7(b) are SEM photographs concerning the surface of the Pr:LSO film before and after the heat treatment, respectively. Referring to FIG. 7(b), a region subdivided into sections on the order of several micrometers is observed unlike FIG. 7(a). It is seen from this fact that the amorphous film has been changed into a Pr:LSO polycrystalline film by the heat treatment.

Figure 8:
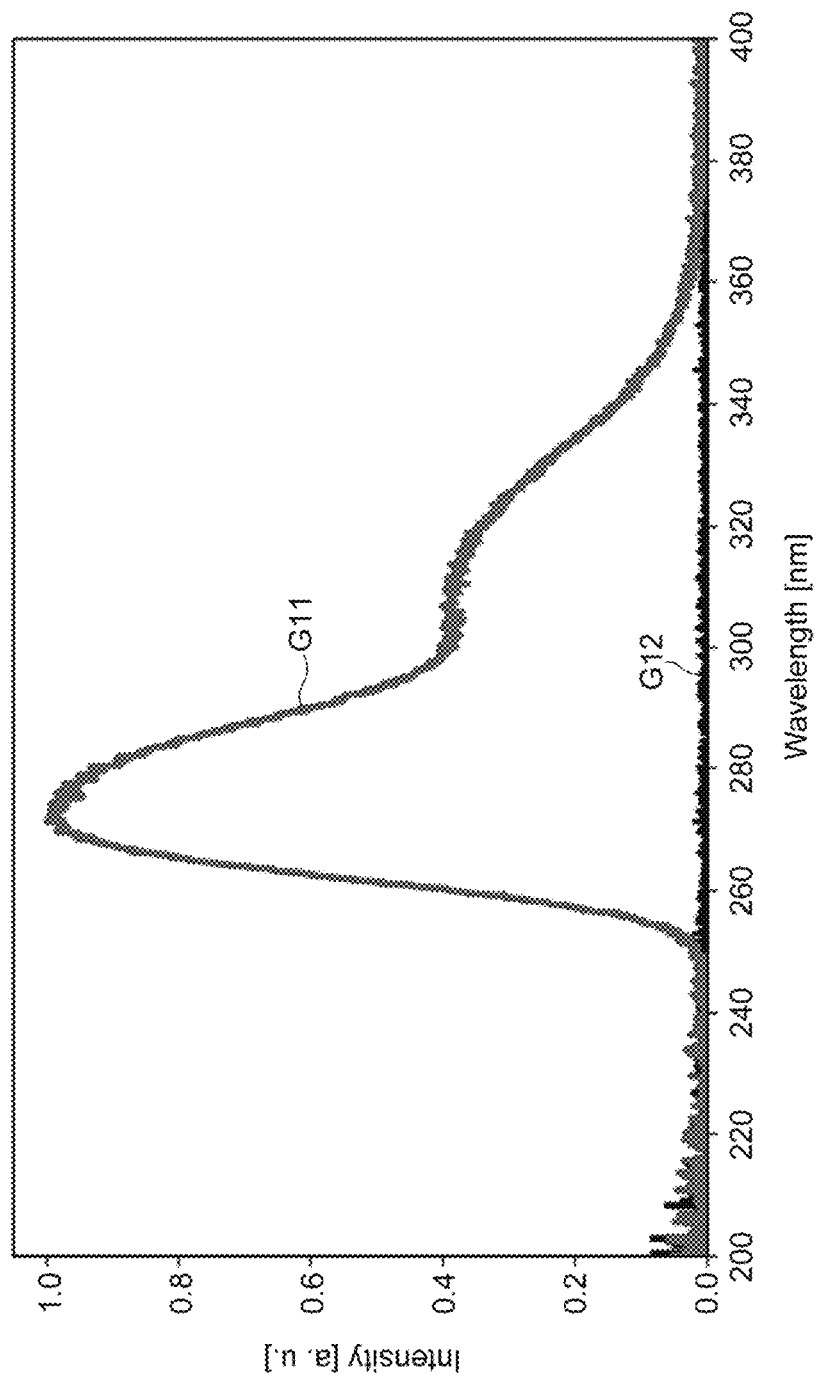
FIG. 8 is a graph illustrating spectra of ultraviolet light obtained by irradiating a Pr:LSO film with an electron beam.

FIG. 8 is a graph illustrating spectra of ultraviolet light obtained by irradiating the Pr:LSO film with an electron beam. In FIG. 8, graphs G11 and G12 represent light emission spectra of the Pr:LSO film after and before the heat treatment, respectively. The film before the heat treatment did not emit light. In these graphs, the electron beam had an acceleration voltage of 10 kV, an intensity (amperage) of 100 μA, and a diameter of 2 mm. As can be seen from FIG. 8, the amorphous film before the heat treatment hardly generated ultraviolet light even when irradiated with the electron beam. By contrast, the polycrystalline Pr:LSO film after the heat treatment favorably generated ultraviolet light upon irradiation with the electron beam.

SECOND EXAMPLE

In this example, the atmosphere at the time of heat treatment, which was a vacuum in the first example, was the air. The other steps, conditions, and the like are the same as those of the first example. As results of X-ray diffractometry of the Pr:LSO film made by this example, diffraction lines deriving from Pr:LSO crystals were observed as in FIG. 6(b).

Figure 9:
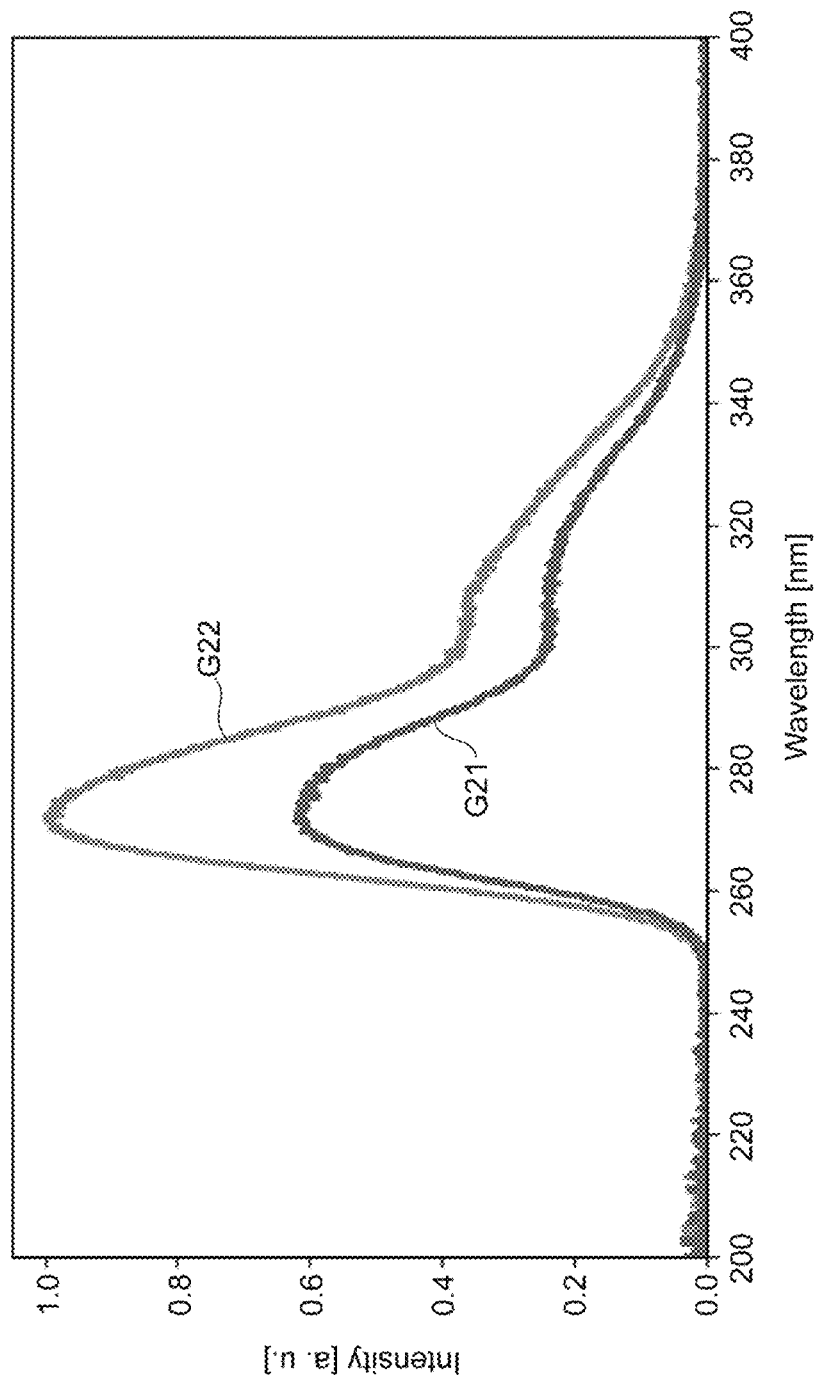
FIG. 9 is a graph illustrating spectra of ultraviolet light obtained by irradiating Pr:LSO films with an electron beam.

FIG. 9 is a graph illustrating spectra of ultraviolet light obtained by irradiating the Pr:LSO film with an electron beam. In FIG. 9, graphs G21 and G22 represent light emission spectra of the Pr:LSO films made by the first example (heat treatment in a vacuum) and the second example (heat treatment in the air), respectively. The electron beam had an acceleration voltage of 10 kV, an intensity (amperage) of 100 µA, and a diameter of 2 mm. As can be seen from FIG. 9, the peak intensity of ultraviolet light generated by irradiation with the electron beam is much higher (i.e., light emission efficiency is much higher) in the Pr:LSO film heat-treated in the air than in the Pr:LSO film heat-treated in a vacuum.

Figure 10:
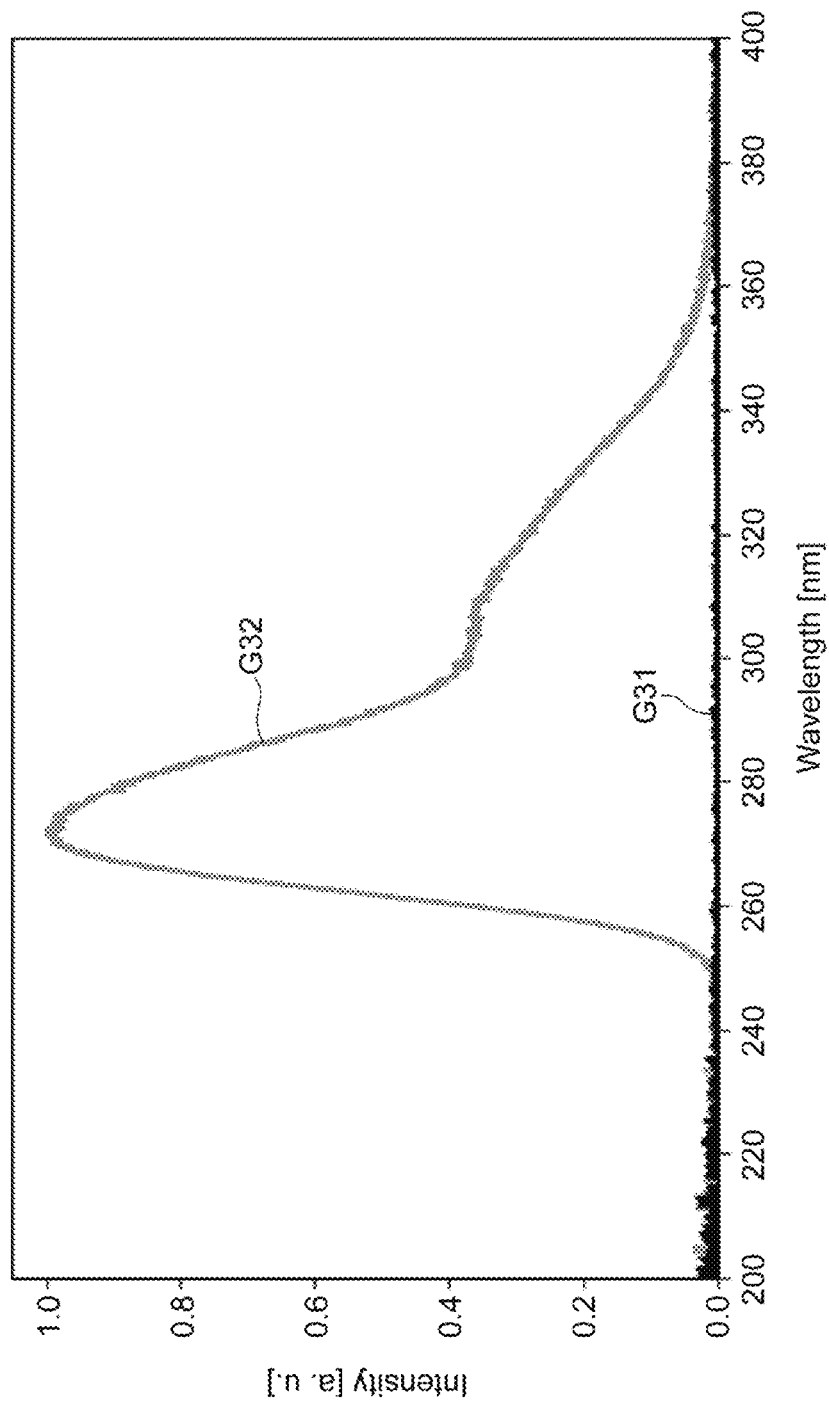
FIG. 10 is a graph illustrating spectra of ultraviolet light obtained by irradiating a Pr:LSO polycrystal-containing substrate with an electron beam as a comparative example.

FIG. 10 is a graph illustrating a spectrum of ultraviolet light obtained by irradiating a Pr:LSO polycrystal-containing substrate with an electron beam under the same condition as with this example as a comparative example. In FIG. 10, graph G31 represents a light emission spectrum concerning the Pr:LSO polycrystal-containing substrate, while graph G32 is identical to the graph G22 of FIG. 9. As can be seen from FIG. 10, the peak intensity of ultraviolet light generated by irradiation with the electron beam is much higher (i.e., light emission efficiency is much higher) in the Pr:LSO polycrystalline film than in the Pr:LSO polycrystal-containing substrate.

THIRD EXAMPLE

Figure 11:
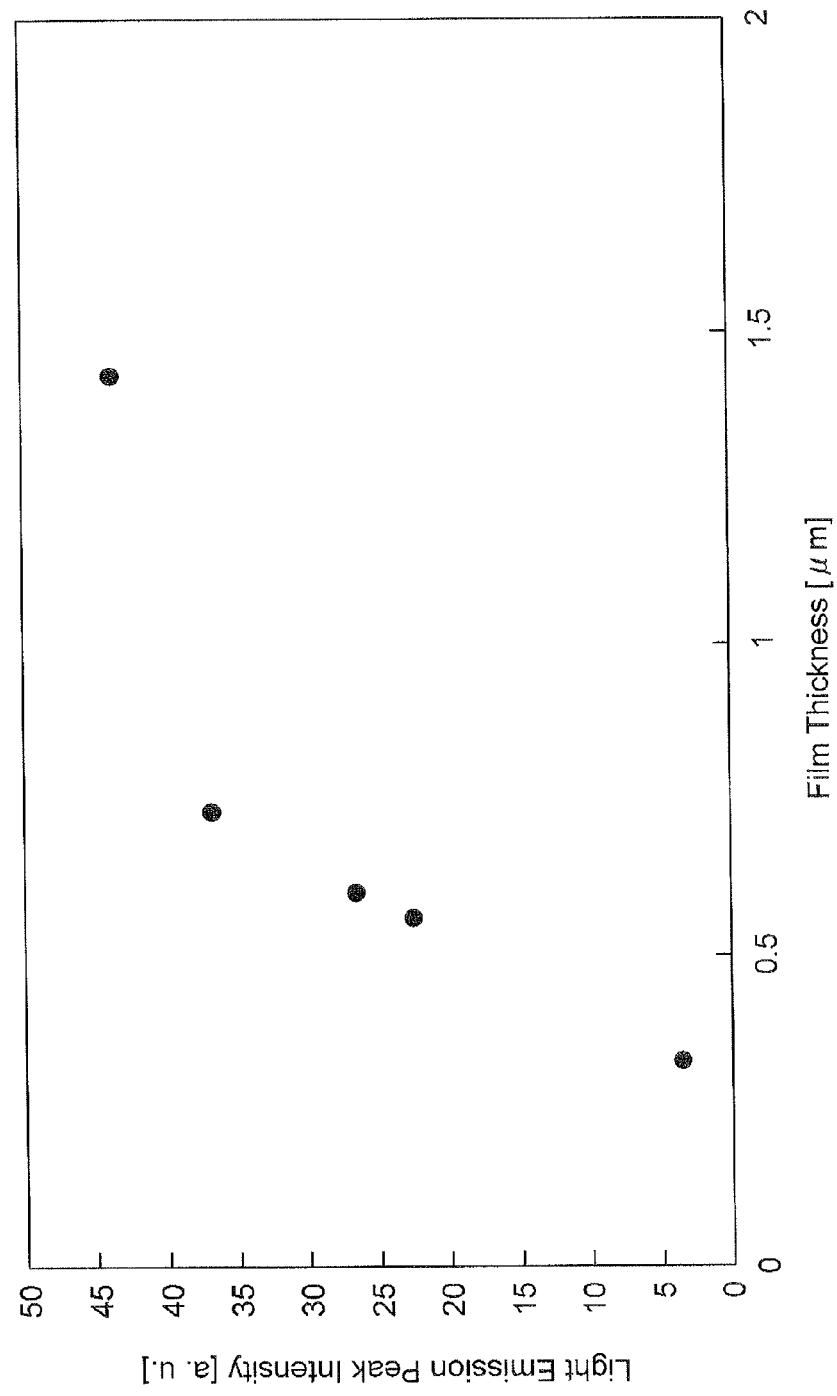
FIG. 11 is a graph illustrating a relationship between the thickness of a Pr:LSO polycrystalline film and peak intensity of ultraviolet light.

The inventors conducted an experiment concerning the relationship between the thickness of the Pr:LSO polycrystalline film and the peak intensity of ultraviolet light. That is, Pr:LSO polycrystalline films were made with various film-forming times, their thicknesses were measured with a step gauge, and then the peak intensity of ultraviolet light generated by irradiating them with an electron beam was measured. FIG. 11 is a graph plotting the resulting relationship between the thickness of the Pr:LSO polycrystalline film and the peak intensity of ultraviolet light.

Referring to FIG. 11, when the thickness of the Pr:LSO polycrystalline film is smaller than a certain value (about 800 nm), the peak intensity of ultraviolet light is higher as the Pr:LSO polycrystalline film is thicker, thereby enhancing the light emission efficiency. When the thickness of the Pr:LSO polycrystalline film exceeds this value, however, the increase in peak intensity of ultraviolet light is small. It is also seen from this graph that a sufficiently practical ultraviolet light intensity (light emission efficiency) is obtained when the thickness of the Pr:LSO polycrystalline film is 0.1 µm or greater.

FOURTH EXAMPLE

First, in this example, three amorphous films were made by vapor-depositing a material containing Pr:LSO. Two of these amorphous films were heat-treated in a vacuum at temperatures of 1000° C. and 1200° C., respectively, so as to make two Pr:LSO polycrystalline films. The remaining one was not heat-treated. The other steps, conditions, and the like are the same as those of the first example. Each of thus made three Pr:LSO films was irradiated with an electron beam (with an acceleration voltage of 10 kV and an intensity (amperage) of 100 µA), and the spectrum of generated ultraviolet light was measured.

Figure 12:
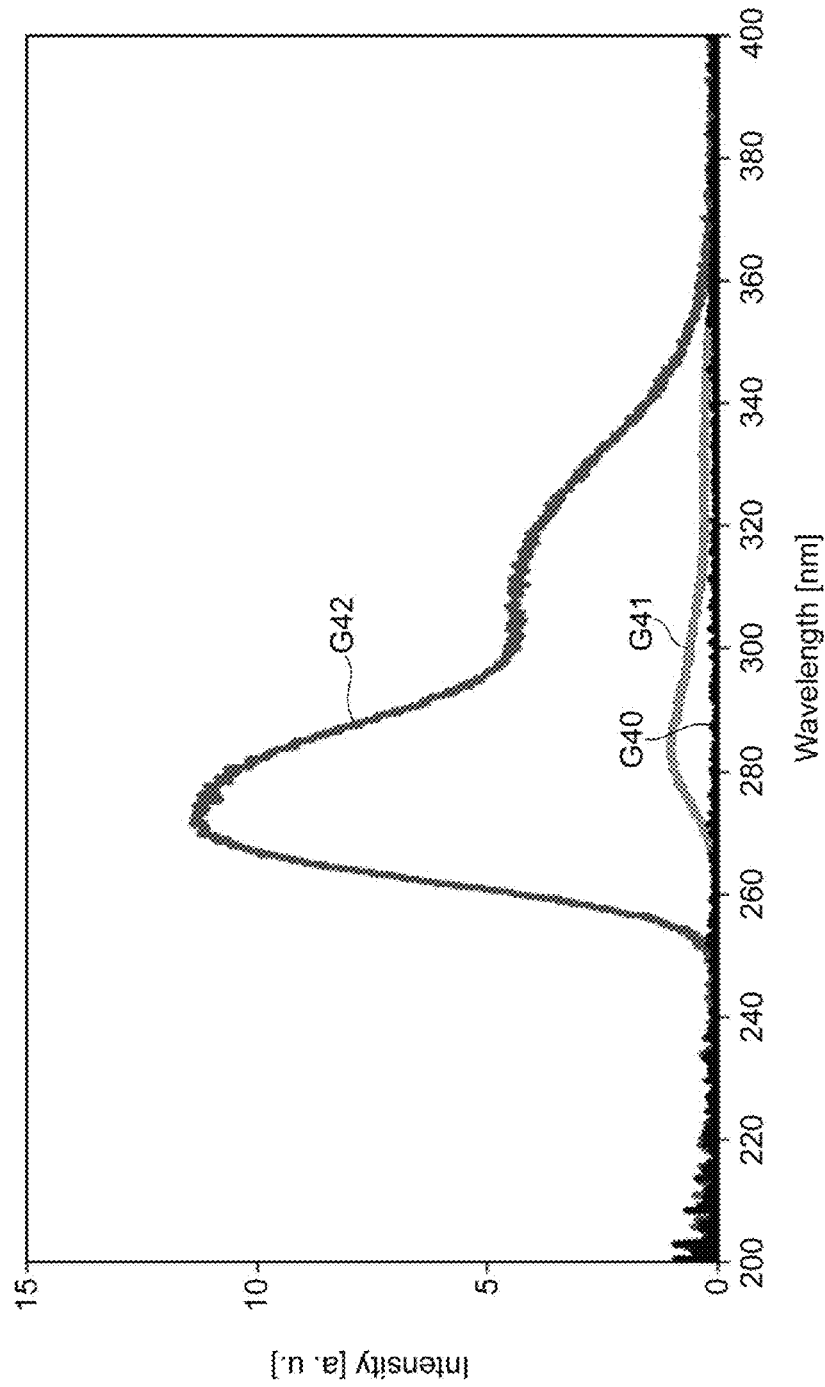
FIG. 12 is a graph illustrating spectra measured in a fourth example.

FIG. 12 is a graph illustrating the measured spectra. In FIG. 12, graphs G40, G41, and G42 represent the respective cases without heat treatment and with heat treatment at temperatures of 1000° C. and 1200° C. As illustrated in FIG. 12, it has been found that the peak intensity of ultraviolet light increases as the heat treatment temperature of the Pr:LSO film rises, thereby yielding higher light emission efficiency.

Figure 13:
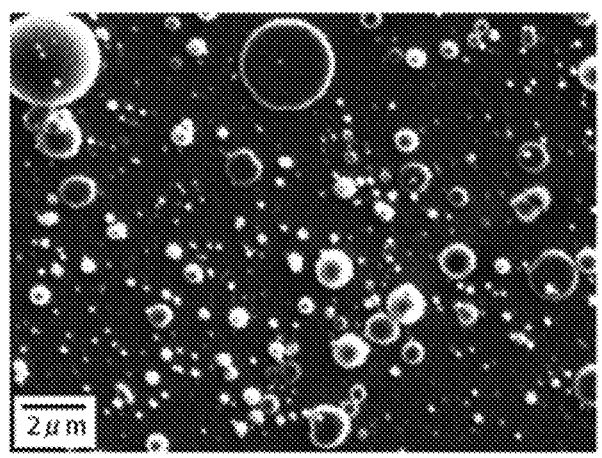
FIG. 13 is an SEM photograph concerning a surface of a Pr:LSO polycrystalline film after heat treatment.
Figure 13:
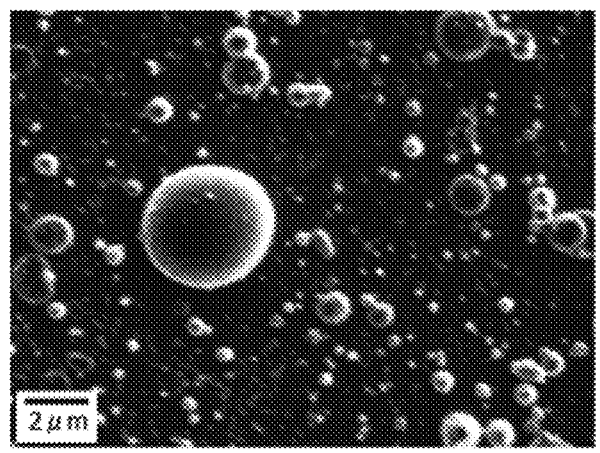
Figure 13:
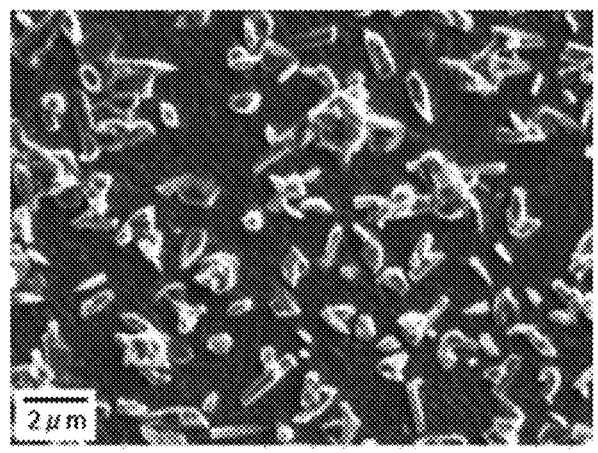

FIG. 13 is an SEM photograph concerning the surface of the Pr:LSO polycrystalline film after the heat treatment. FIGS. 13(a), 13(b), and 13(c) illustrate the Pr:LSO film surface in the respective cases without heat treatment and with heat treatment at temperatures of 1000° C. and 1200° C. It is seen from FIG. 13 that the crystallization of Pr:LSO advances as the heat treatment temperature is higher.

FIFTH EXAMPLE

First, in this example, three amorphous films were made by vapor-depositing a material containing Pr:LSO. Two of these amorphous films were heat-treated in the air at temperatures of 1200° C. and 1400° C., respectively, so as to make two Pr:LSO polycrystalline films. The remaining one was not heat-treated. The other steps, conditions, and the like are the same as those of the first example. Each of thus made three Pr:LSO films was irradiated with an electron beam (with an acceleration voltage of 10 kV and an intensity (amperage) of 100 µA), and the spectrum of generated ultraviolet light was measured.

Figure 14:
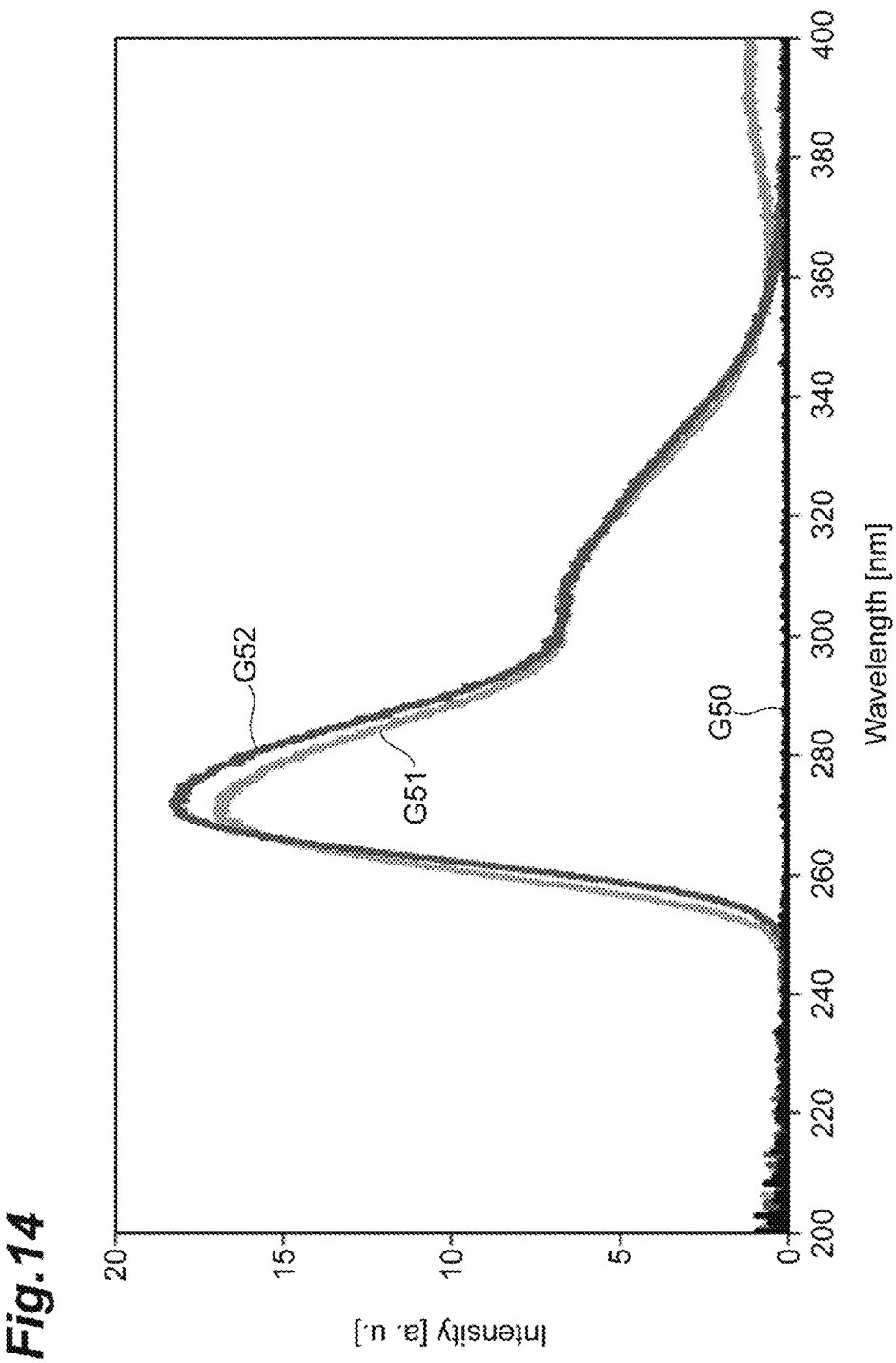
FIG. 14 is a graph illustrating spectra measured in a fifth example.

FIG. 14 is a graph illustrating the measured spectra. In FIG. 14, graphs G50, G51, and G52 represent the respective cases without heat treatment and with heat treatment at temperatures of 1000° C. and 1200° C. As illustrated in FIG. 14, substantially the same light emission characteristic was obtained whether the heat treatment temperature of the Pr:LSO film was 1200° C. or 1400° C. when the heat treatment was performed in the air.

As also illustrated in FIG. 9, the light emission peak intensity in the case where the atmosphere at the time of heat treatment was at the atmospheric pressure (at the ultraviolet light emission peak wavelength of 275 nm) was about 1.5 times that in the case where the atmosphere at the time of heat treatment was a vacuum. Therefore, the atmosphere at the time of heat treatment is more preferably at the atmospheric pressure. Whether the atmosphere at the time of heat treatment is substantially at the atmospheric pressure or a vacuum, the heat treatment temperature is preferably at least 1000° C. It will be more preferred if the heat treatment temperature is 1200° C. to 1900° C. in particular.

SIXTH EXAMPLE

In this example, four amorphous films were made by vapor-depositing a material containing Pr:LSO and then heat-treated (for 2 hr) in a heat treatment furnace with a vacuum atmosphere at respective temperatures of 1000° C., 1200° C., 1400° C., and 1500° C., so as to form Pr:LSO polycrystalline films. The other steps, conditions, and the like are the same as those of the first example. Each of thus made Pr:LSO polycrystalline films was irradiated with an electron beam (with an acceleration voltage of 10 kV and an intensity (amperage) of 100 µA), and the spectrum of generated ultraviolet light was measured.

Figure 15:
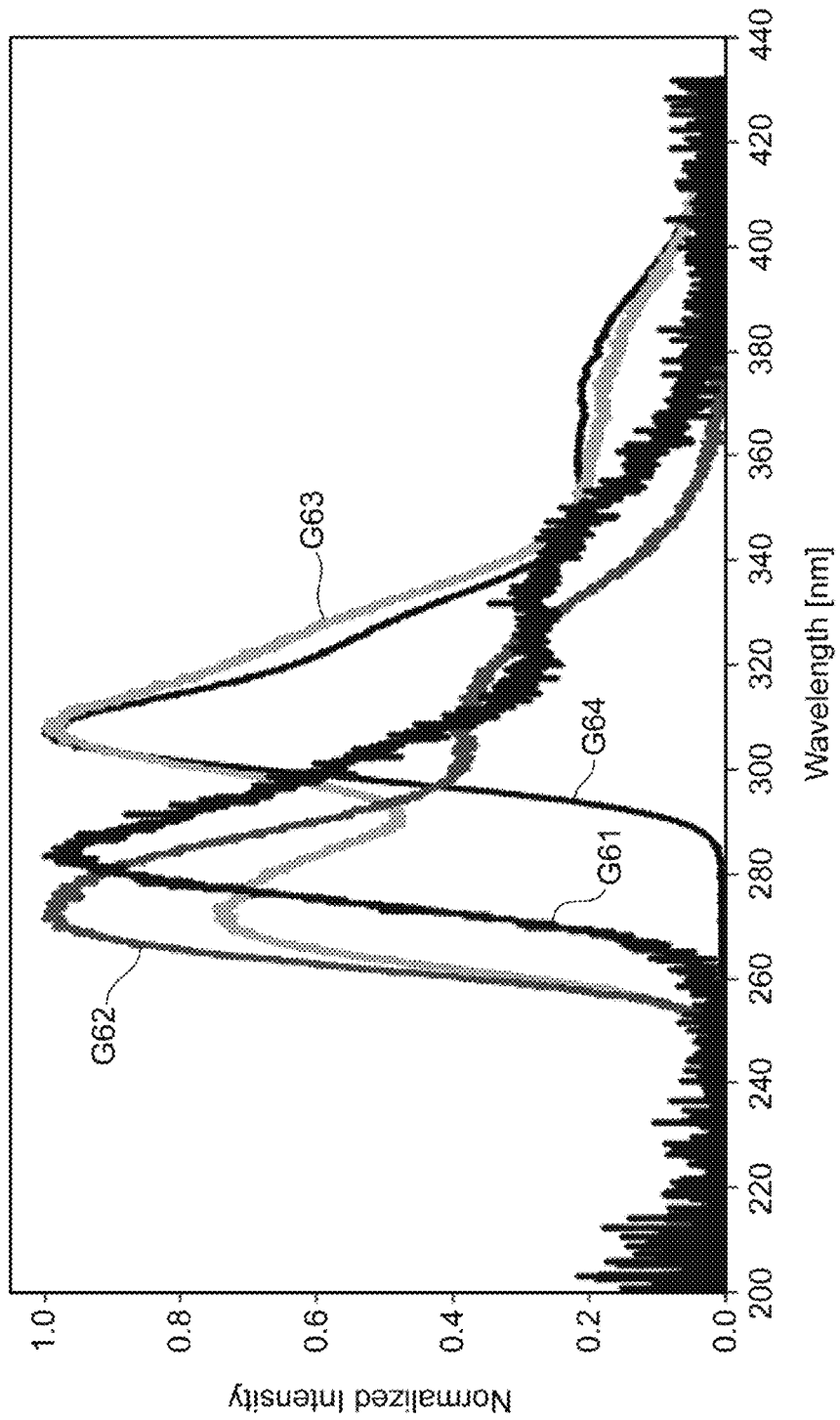
FIG. 15 is a graph illustrating spectra obtained by normalizing measured light emission spectra with peak values.

FIG. 15 is a graph illustrating spectra obtained by normalizing the measured spectra with peak values. In FIG. 15, graphs G61, G62, G63, and G64 represent cases where the heat treatment temperature was 1000° C., 1200° C., 1400° C., and 1500° C., respectively. As illustrated in FIG. 15, the ultraviolet light emission peak wavelength was 285 nm at the heat treatment temperature of 1000° C., 275 nm at 1200° C., 310 nm and 275 nm at 1400° C., and 310 nm at 1500° C. Since the ultraviolet light emission peak wavelength thus varies depending on the heat treatment temperature, it is preferred for the heat treatment temperature to be set according to the wavelength of ultraviolet light required for the target for ultraviolet light generation.

Other examples concerning the above-mentioned embodiment will be explained in the following. The seventh to thirteenth examples to be explained in the following are examples concerning the case where the polycrystalline film of the light-emitting layer 22 is constituted by a Pr:LuAG polycrystal. The facts found out from these examples seem to be the same in rare-earth-containing aluminum garnet polycrystals doped with an activator having a composition similar to that of the Pr:LuAG polycrystal, e.g., Sc:LuAG, La:LuAG, Bi:LuAG, Sc:YAG, and La:YAG polycrystals.

SEVENTH EXAMPLE

First, in this example, a ceramic containing 0.8 atom % of Pr was made as the material 53. Subsequently, this Pr:LuAG-containing ceramic was mounted on the sample mount 52 of the laser ablation device 50, while a sapphire substrate having a diameter of 2 inch was installed on the rotary holder 55. The distance between the Pr:LuAG-containing ceramic and sapphire substrate was 150 mm. Thereafter, the vacuum container 51 was evacuated, and the sapphire substrate was heated to 1000° C. Then, while feeding the oxygen gas into the vacuum container 51, the material 53 was irradiated with the laser beam B for 60 min, so as to make an amorphous film. At this time, a KrF excimer laser (100 mJ, 100 Hz) was used as a laser light source for the laser beam B. Thereafter, the sapphire substrate was put into a heat treatment furnace, and the sapphire substrate and amorphous film were heated for 2 hr at 1400° C. in the air.

Figure 16:
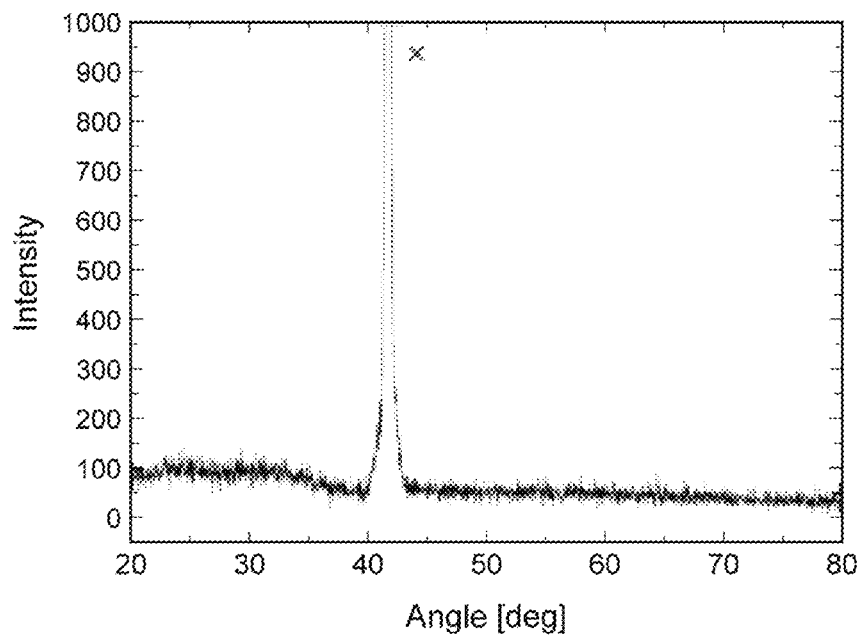
FIGS. 16(a) and 16(b) are graphs illustrating results of X-ray diffractometry of an amorphous film before and after heat treatment, respectively.
Figure 16:
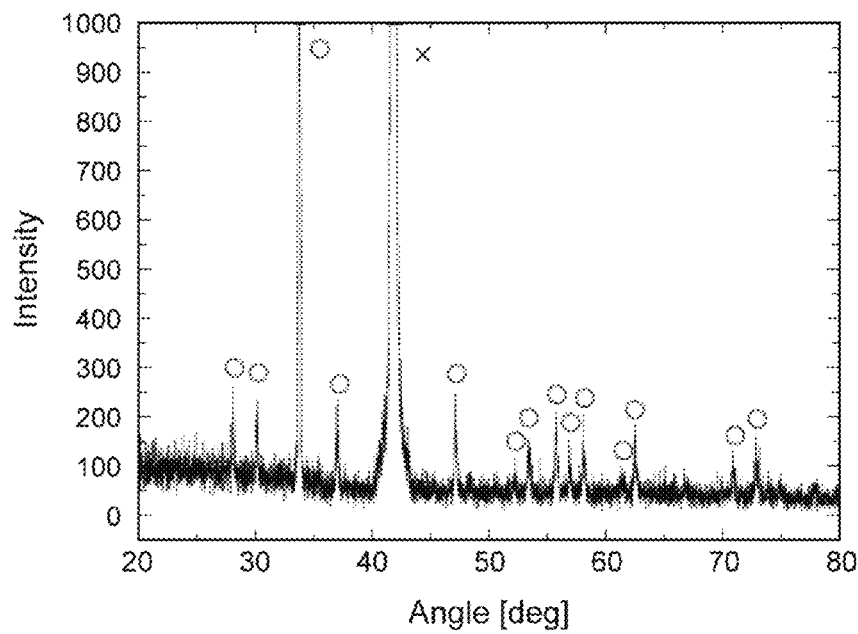

FIG. 16(a) is a graph illustrating results of X-ray diffractometry of the amorphous film before the heat treatment. FIG. 16(b) is a graph illustrating results of X-ray diffractometry of the film after the heat treatment. As illustrated by these graphs, while only a diffraction line deriving from the sapphire substrate (indicated by a cross in the graph) was observed before the heat treatment, diffraction lines deriving from Pr:LuAG crystals (indicated by circles in the graph) were observed in addition to the former diffraction line after the heat treatment. It is seen from these graphs that the amorphous film has been changed into a Pr:LuAG polycrystal by the heat treatment.

Figure 17:
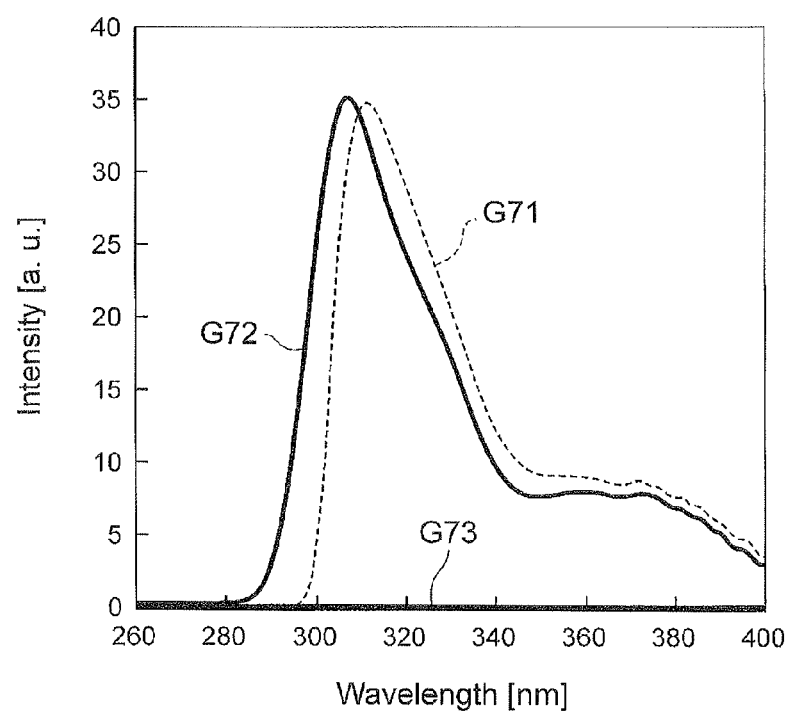
FIG. 17 is a graph illustrating spectra of ultraviolet light obtained by irradiating a Pr:LuAG film with an electron beam.

FIG. 17 is a graph illustrating spectra of ultraviolet light obtained by irradiating the Pr:LuAG film with an electron beam. In FIG. 17, graphs G71, G72, and G73 represent light emission spectra of the Pr:LuAG polycrystal as a vapor deposition material (a raw material for laser ablation), the Pr:LuAG film after the heat treatment, and the Pr:LuAG film before the heat treatment, respectively. The film before the heat treatment did not emit light. The electron beam had an acceleration voltage of 10 kV, an intensity (amperage) of 100 μA, and a diameter of 2 mm. As can be seen from FIG. 17, the amorphous film before the heat treatment hardly generated ultraviolet light even when irradiated with the electron beam. By contrast, the polycrystalline Pr:LuAG film after the heat treatment favorably generated ultraviolet light upon irradiation with the electron beam.

EIGHTH EXAMPLE

In this example, the temperature of the sapphire substrate at the time of forming the Pr:LuAG film, which was 1000° C. in the seventh example, was changed to 800° C. The heat treatment temperature, which was 1400° C. in the seventh example, was changed to 1600° C. The other steps, conditions, and the like are the same as those of the seventh example.

Figure 18:
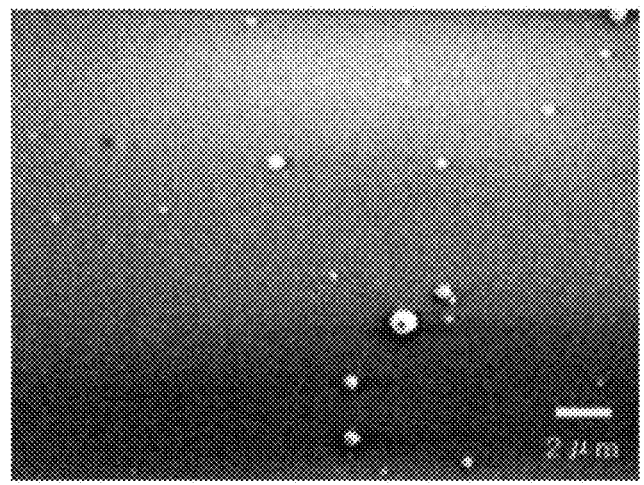
FIGS. 18(a) and 18(b) are SEM photographs concerning a surface of a Pr:LuAG film before and after heat treatment, respectively.
Figure 18:
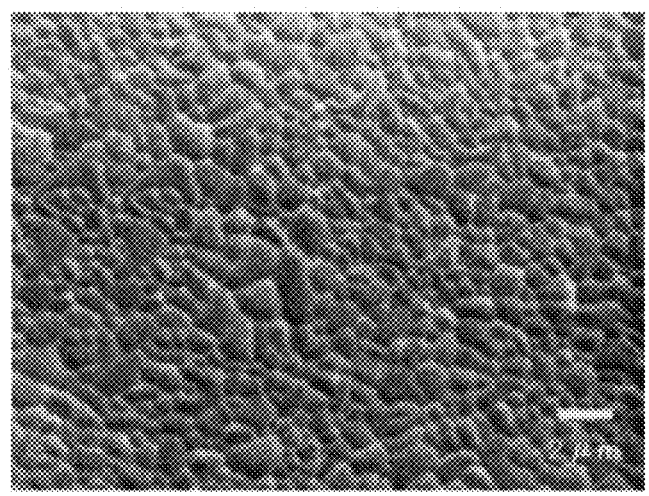

As a result of X-ray diffractometry of the Pr:LuAG film made by this example, diffraction lines deriving from Pr:LuAG crystals were observed as in FIG. 16(b). FIGS. 18(a) and 18(b) are SEM photographs concerning the surface of the Pr:LuAG film before and after the heat treatment, respectively. Referring to FIG. 18(b), a region subdivided into sections on the order of several micrometers is observed unlike FIG. 18(a). It is seen from these facts that the amorphous film has been changed into a Pr:LuAG polycrystal by the heat treatment. Irradiating this Pr:LuAG polycrystalline film with an electron beam yielded ultraviolet light having a spectrum with the same peak wavelength as with the graph G72 of FIG. 17. This peak intensity is higher than that of the graph G72 of FIG. 17, making the light emission efficiency higher than that of the seventh example.

NINTH EXAMPLE

In this example, the atmosphere at the time of heat treatment, which was the air in the eighth example, was changed to a vacuum ($10^{-2}$ Pa). The other steps, conditions, and the like are the same as those of the eighth example. As a result of X-ray diffractometry of the Pr:LuAG film made by this example, diffraction lines deriving from Pr:LuAG crystals were observed as in FIG. 16(b).

Figure 19:
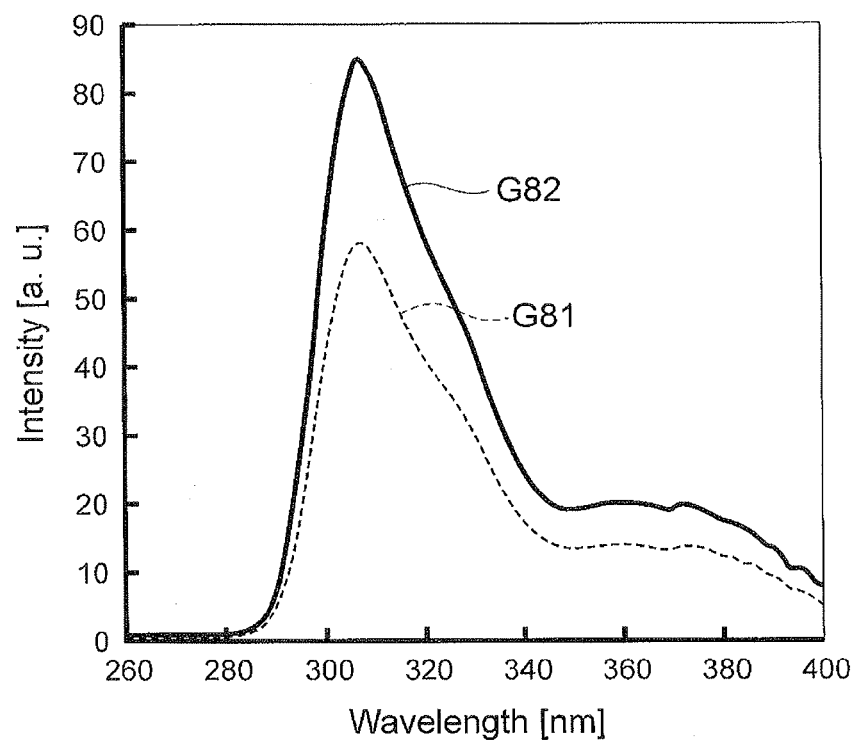
FIG. 19 is a graph illustrating spectra of ultraviolet light obtained by irradiating Pr:LuAG films with an electron beam.

FIG. 19 is a graph illustrating spectra of ultraviolet light obtained by irradiating Pr:LuAG films with an electron beam. In FIG. 19, Graphs G81 and G82 illustrate light emission spectra of the Pr:LuAG film made by the eighth example (heat treatment in the air) and the Pr:LuAG film made by the ninth example (heat treatment in a vacuum), respectively. The electron beam had an acceleration voltage of 10 kV, an intensity (amperage) of 100 μA, and a diameter of 2 mm. As can be seen from FIG. 19, the peak intensity of ultraviolet light generated by irradiation with the electron beam is much higher (i.e., light emission efficiency is much higher) in the Pr:LuAG film heat-treated in a vacuum than in the Pr:LuAG film heat-treated in the air.

Figure 20:
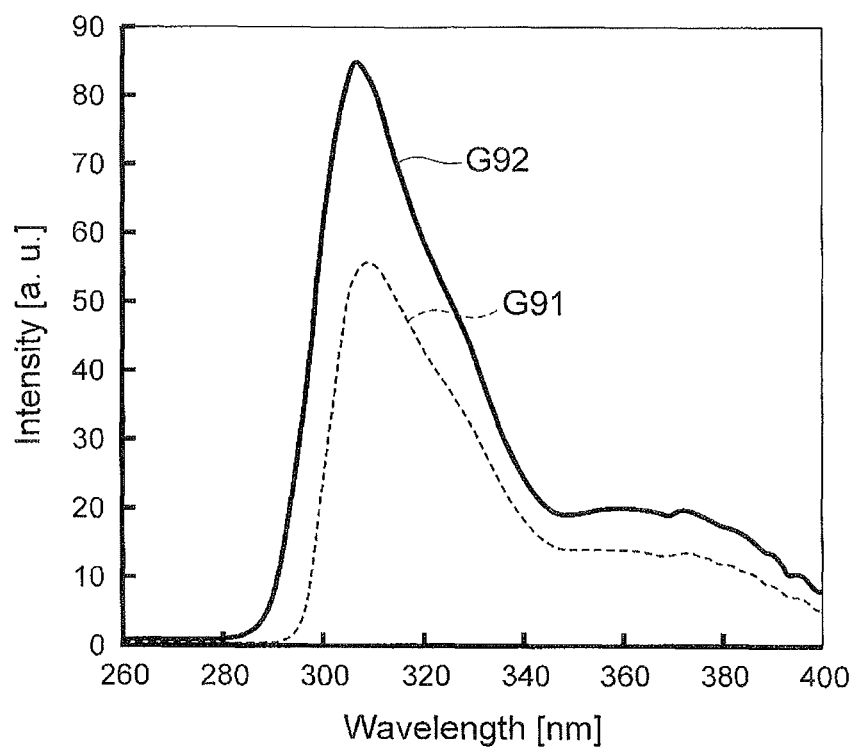
FIG. 20 is a graph illustrating a spectrum of ultraviolet light obtained by irradiating a Pr:LuAG monocrystalline substrate with an electron beam under the same condition as with a ninth example as a comparative example.

FIG. 20 is a graph illustrating a spectrum of ultraviolet light obtained by irradiating a Pr:LuAG monocrystalline substrate with an electron beam under the same condition as with this example. In FIG. 20, graph G91 represents a light emission spectrum concerning the Pr:LuAG monocrystalline substrate, while graph G92 is identical to the graph G82 of FIG. 19. As can be seen from FIG. 20, the peak intensity of ultraviolet light generated by irradiation with the electron beam is much higher (i.e., light emission efficiency is much higher) in the Pr:LuAG polycrystalline thin film than in the Pr:LuAG monocrystalline substrate.

Figure 21:
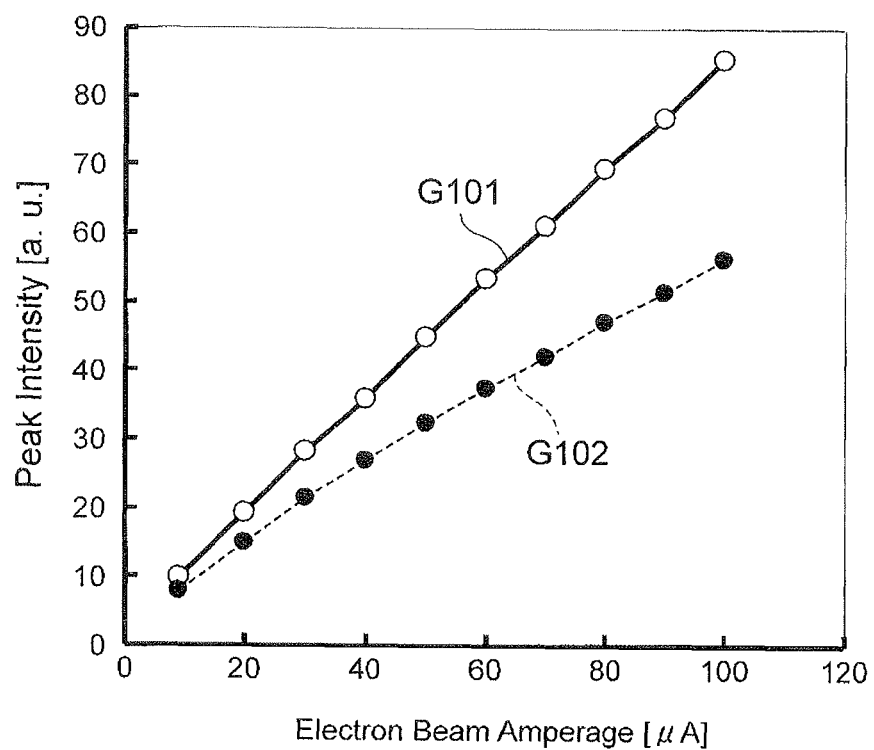
FIG. 21 is a graph illustrating changes in peak intensity of ultraviolet light occurring when varying the intensity (amperage) of an electron beam.

FIG. 21 is a graph illustrating changes in peak intensity of ultraviolet light occurring when varying the intensity (amperage) of an electron beam. In FIG. 21, graphs G101 and G102 represent light emission spectra concerning the Pr:LuAG polycrystalline thin film made by this example and the Pr:LuAG monocrystalline substrate of the comparative example, respectively. As illustrated in FIG. 21, it has been found out that the intensity of the electron beam and the peak intensity of ultraviolet light have an extremely favorable proportionality (high linearity) therebetween in the Pr:LuAG polycrystalline thin film made by this example. It has also been found out that, regardless of the intensity of the electron beam, the Pr:LuAG polycrystalline thin film made by this example can achieve a peak intensity higher than that of the Pr:LuAG monocrystalline substrate and inhibit the light emission efficiency from dropping even in regions where the electron beam is strong.

TENTH EXAMPLE

Figure 22:
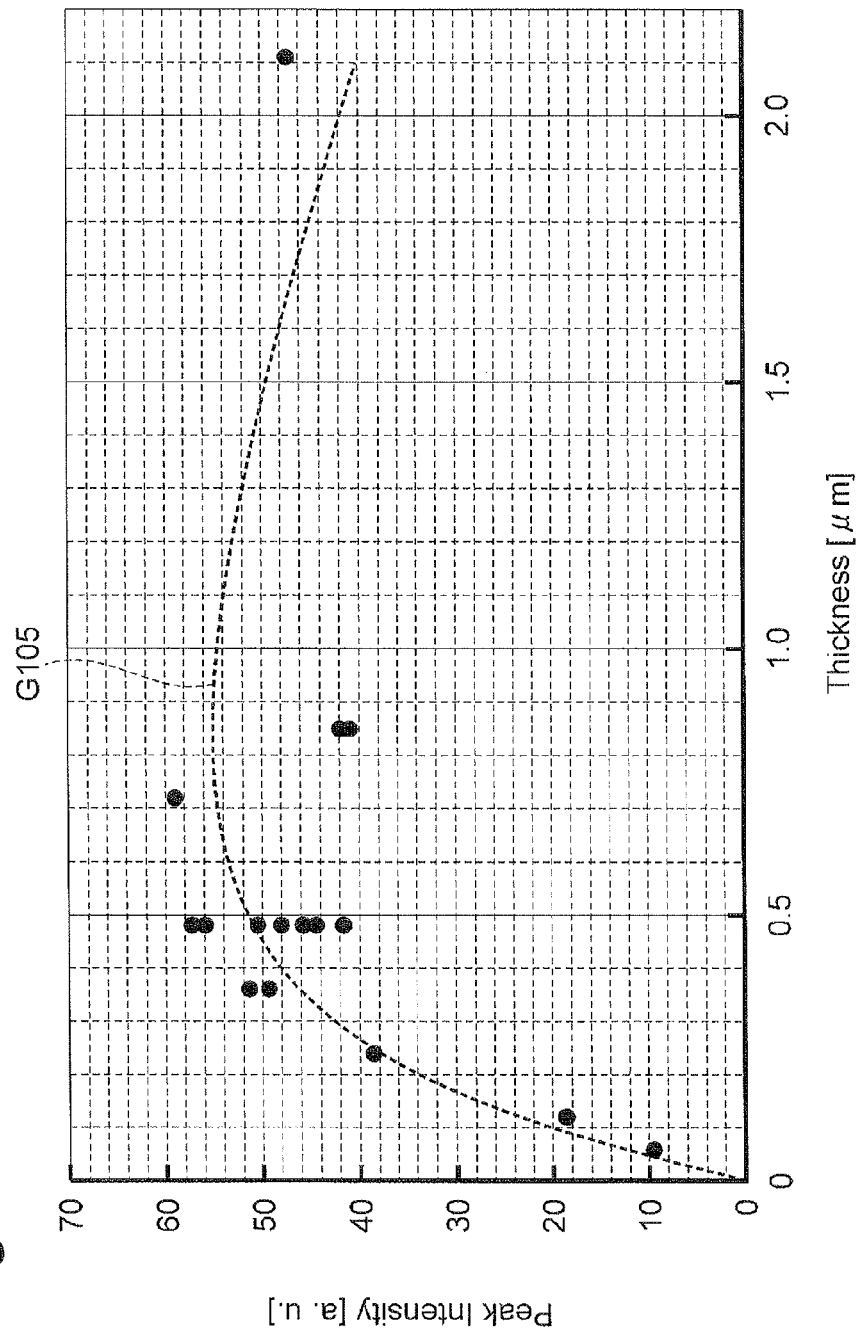
FIG. 22 is a graph illustrating a relationship between the thickness of a Pr:LuAG polycrystalline film and peak intensity of ultraviolet light.

The inventors conducted an experiment concerning the relationship between the thickness of the Pr:LuAG polycrystalline film and the peak intensity of ultraviolet light. That is, Pr:LuAG polycrystalline films were made with various film-forming times, their thicknesses were measured with a step gauge, and then the peak intensity of ultraviolet light generated by irradiating them with an electron beam was measured. FIG. 22 is a graph plotting the resulting relationship between the thickness of the Pr:LuAG polycrystalline film and the peak intensity of ultraviolet light. Curve G105 in the graph is a fitted curve.

Referring to FIG. 22, when the thickness of the Pr:LuAG polycrystalline film is smaller than a certain value (about 500 nm), the peak intensity of ultraviolet light is higher as the Pr:LuAG polycrystalline film is thicker, thereby enhancing the light emission efficiency. When the thickness of the Pr:LuAG polycrystalline film exceeds this value, however, the peak intensity of ultraviolet light does not increase substantially or decreases instead. It is also seen from this graph that a sufficiently practical ultraviolet light intensity (light emission efficiency) is obtained when the thickness of the Pr:LuAG polycrystalline film is 0.1 μm or greater.

ELEVENTH EXAMPLE

Figure 23:
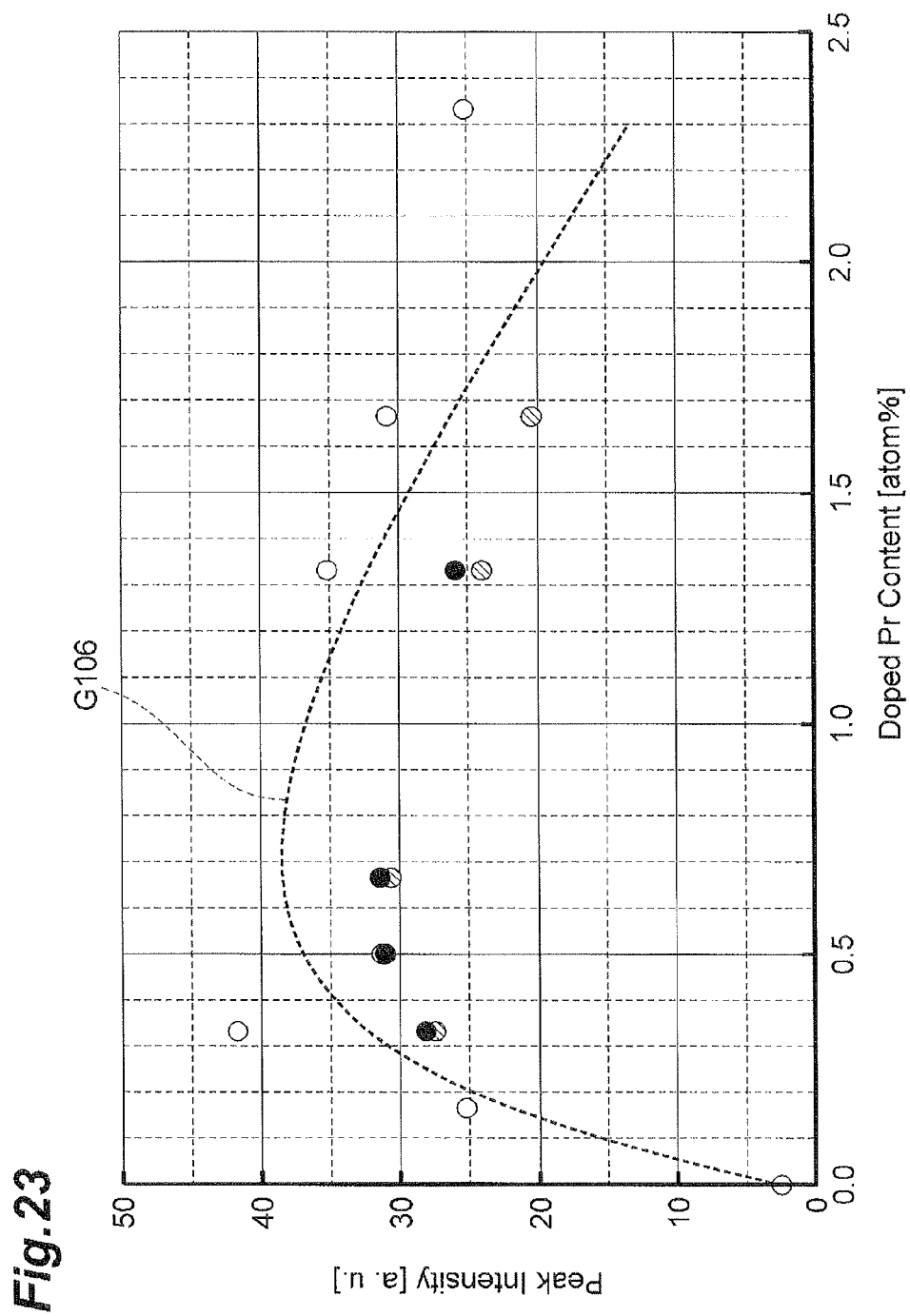
FIG. 23 is a graph illustrating a relationship between the Pr content in Pr:LuAG-containing materials and peak intensity of ultraviolet light.

The inventors conducted an experiment concerning the relationship between the Pr content in Pr:LuAG-containing materials and the peak intensity of ultraviolet light. That is, Pr:LuAG-containing materials were made with various Pr contents, Pr:LuAG polycrystalline films were produced by using them, and the peak intensity of ultraviolet light generated by irradiating these Pr:LuAG polycrystalline films with an electron beam was measured. In this example, the heat treatment temperature was 1600° C. FIG. 23 is a graph plotting the resulting relationship between the Pr content in Pr:LuAG-containing materials and the peak intensity of ultraviolet light. Curve G106 in the graph is a fitted curve.

Referring to FIG. 23, when the Pr content in Pr:LuAG-containing materials is lower than a certain value (about 0.7 atom %), the peak intensity of ultraviolet light is higher as the Pr content is greater, thereby enhancing the light emission efficiency. When the Pr content in Pr:LuAG-containing materials exceeds this value, however, the peak intensity of ultraviolet light decreases instead. It is also seen from this graph that the Pr content in Pr:LuAG-containing materials is preferably at least 0.05 atom % but not more than 2.0 atom %, more preferably at least 0.1 atom % but not more than 1.0 atom %. A sufficiently practical ultraviolet light intensity is seen to be obtained thereby.

While the relationship between the Pr content in Pr:LuAG-containing materials and the peak intensity of ultraviolet light is explained in this example, the relationship between the Pr content in Pr:LuAG polycrystalline films and the peak intensity of ultraviolet light seems to have a tendency similar to the graph illustrated in FIG. 22. However, a preferred range of the Pr content in Pr:LuAG polycrystalline films is at least 0.001 atom % but not more than 10 atom %, for example.

TWELFTH EXAMPLE

In this example, six amorphous films were made by vapor-depositing a material containing Pr:LuAG, and these amorphous films were heat-treated in a vacuum at temperatures of 1200° C., 1400° C., 1500° C., 1600° C., 1700° C., 1800° C., and 1900° C., respectively, so as to form Pr:LuAG polycrystalline films. The other steps, conditions, and the like are the same as those of the eighth example. Each of thus made Pr:LuAG polycrystalline films was irradiated with an electron beam (with an acceleration voltage of 10 kV and an intensity (amperage) of 100 μA), and the spectrum of generated ultraviolet light was measured.

Figure 24:
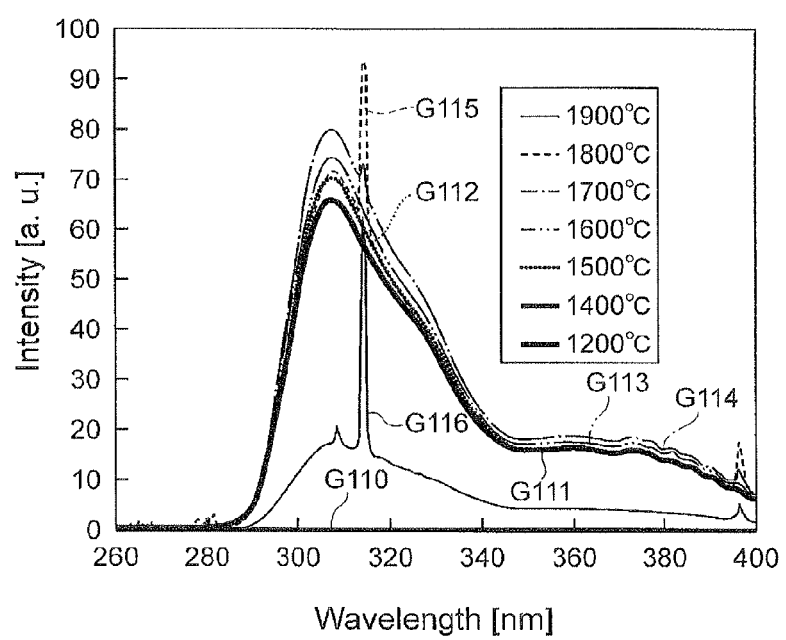
FIG. 24 is a graph illustrating spectra measured in a twelfth example.

FIG. 24 is a graph illustrating the measured spectra. In FIG. 24, graphs G110, G111, G112, G113, G114, G115, and G116 represent the respective cases with heat treatment at temperatures of 1200° C., 1400° C., 1500° C., 1600° C., 1700° C., 1800° C., and 1900° C. As illustrated in FIG. 24, it has been found that the peak intensity of ultraviolet light increases as the heat treatment temperature of the Pr:LuAG film rises, thereby yielding higher light emission efficiency. It has also been found that very sharp light emission peaks appear in spectra when the heat treatment temperature is so high as to fall within the range of 1800° C. to 1900° C. No light was emitted when the treatment temperature was 1200° C. The heat treatment temperature is preferably 1400° C. to 1800° C. when utilizing wide wavelength regions and 1800° C. to 1900° C. when utilizing light emission peak waveforms.

Figure 25:
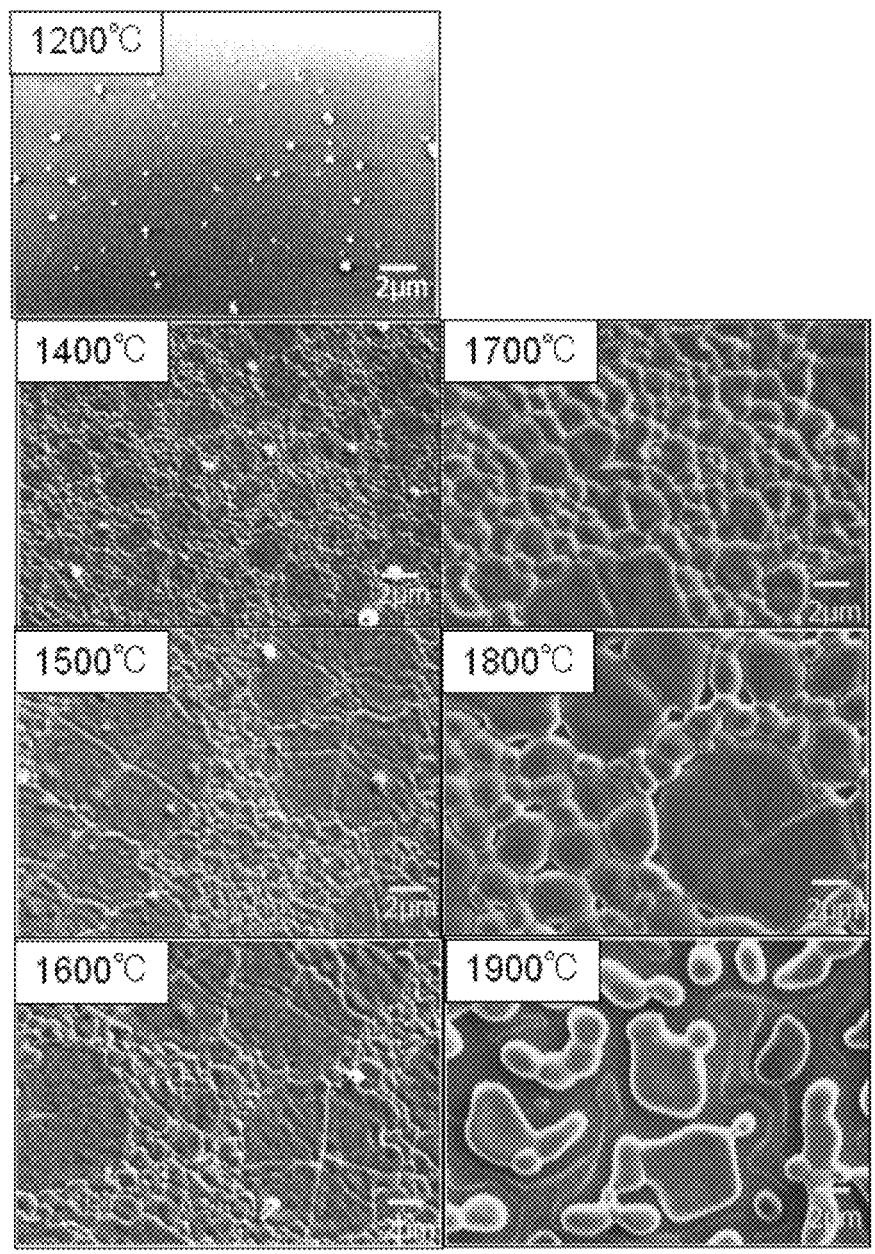
FIG. 25 is an SEM photograph concerning a surface of a Pr:LuAG polycrystalline film after heat treatment.

FIG. 25 is an SEM photograph concerning the surface of the Pr:LuAG polycrystalline film after the heat treatment. FIG. 25 represents SEM photographs in the respective cases with heat treatment at temperatures of 1200° C., 1400° C., 1500° C., 1600° C., 1700° C., 1800° C., and 1900° C. It is seen from FIG. 25 that the crystallization of Pr:LuAG advances as the heat treatment temperature is higher. At 1200° C., the surface of the Pr:LuAG polycrystalline film was seen to be in substantially the same state as the amorphous film before heat treatment illustrated in FIG. 18(a).

THIRTEENTH EXAMPLE

In this example, four amorphous films were made by vapor-depositing a material containing Pr:LuAG, and these amorphous films were heat-treated in a heat treatment furnace with the air atmosphere at respective temperatures of 1200° C., 1400° C., 1600° C., and 1700° C., so as to form Pr:LuAG polycrystalline films. The other steps, conditions, and the like are the same as those of the eighth example. Each of thus made Pr:LuAG polycrystalline films was irradiated with an electron beam (with an acceleration voltage of 10 kV and an intensity (amperage) of 100 μA), and the spectrum of generated ultraviolet light was measured.

Figure 26:
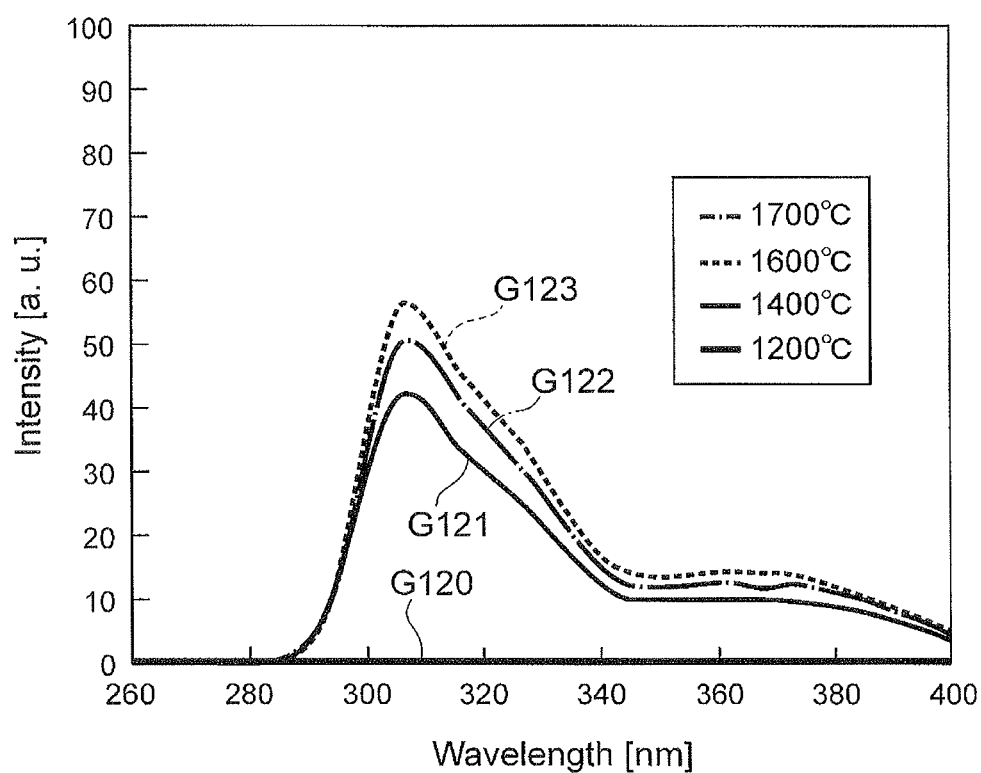
FIG. 26 is a graph illustrating spectra measured in a thirteenth example.

FIG. 26 is a graph illustrating the measured spectra. In FIG. 26, graphs G120, G121, G122, and G123 represent the respective cases with heat treatment at temperatures of 1200° C., 1400° C., 1700° C., and 1600° C. As illustrated in FIG. 26, it is also seen in the case where the heat treatment is performed in the air that the peak intensity of ultraviolet light increases as the heat treatment temperature rises, thereby yielding higher light emission efficiency. Here, the light emission efficiency was the highest in the case where the heat treatment temperature was 1600° C. No light was emitted when the treatment temperature was 1200° C. in this case, either.

The peak intensity (at 310 nm) in the case where the atmosphere at the time of heat treatment was the air was about ⅔ that in the case where the atmosphere at the time of heat treatment was a vacuum. The atmosphere at the time of heat treatment is preferably at the atmospheric pressure or lower. The atmosphere lower than the atmospheric pressure is more preferably a vacuum ($10^{-2}$ Pa or lower). Whether the atmosphere at the time of heat treatment is substantially at the atmospheric pressure or a vacuum, the heat treatment temperature is preferably at least 1400° C. It will be more preferred if the heat treatment temperature is 1400° C. to 1900° C. in particular.

The target for ultraviolet light generation, electron-beam-excited ultraviolet light source, and method for manufacturing a target for ultraviolet light generation in accordance with one aspect of the present invention are not limited to the embodiment mentioned above, but can be modified in various ways. For example, while each of the above-mentioned embodiment and examples forms an amorphous film by vapor deposition at first and obtains a polycrystalline film by heat-treating this film, the polycrystalline film may be made by methods other than such a method.

INDUSTRIAL APPLICABILITY

The target for ultraviolet light generation, electron-beam-excited ultraviolet light source, and method for manufacturing a target for ultraviolet light generation in accordance with one aspect of the present invention can enhance ultraviolet light generation efficiency.

REFERENCE SIGNS LIST

10: electron-beam-excited ultraviolet light source; 11: envelope; 12: electron source; 13: extraction electrode; 16: power supply part; 20: target for ultraviolet light generation; 21: substrate; 21a: principal surface; 21b: rear face; 22: light-emitting layer; 23: aluminum film; 50: laser ablation device; 51: vacuum container; 52: sample mount; 53: material; 54: laser inlet; 55: rotary holder; 56: heater; 57: gas inlet; B: laser beam; EB: electron beam; UV: ultraviolet light.

The invention claimed is:

1. A target for ultraviolet light generation comprising:
   a substrate adapted to transmit ultraviolet light therethrough; and
   a light-emitting layer disposed on the substrate and generating ultraviolet light in response to an electron beam;
   wherein the light-emitting layer includes a polycrystalline film constituted by an oxide polycrystal containing Lu and Si doped with an activator.

2. A target for ultraviolet light generation according to claim 1, wherein the oxide polycrystal includes at least one of LPS and LSO.

3. A target for ultraviolet light generation according to claim 2, wherein the activator is Pr.

4. A target for ultraviolet light generation according to claim 1, wherein the polycrystalline film has a thickness of at least 0.1 µm but not more than 10 µm.

5. A target for ultraviolet light generation according to claim 1, wherein the substrate is constituted by sapphire, silica, or rock crystal.

6. An electron-beam-excited ultraviolet light source comprising:
   the target for ultraviolet light generation according to claim 1; and
   an electron source providing the target with the electron beam.

7. A target for ultraviolet light generation comprising:
   a substrate adapted to transmit ultraviolet light therethrough; and
   a light-emitting layer disposed on the substrate and generating ultraviolet light in response to an electron beam;
   wherein the light-emitting layer includes a polycrystalline film constituted by a rare-earth-containing aluminum garnet polycrystal doped with an activator, the polycrystalline film having an ultraviolet light emission peak wavelength of 300 nm or shorter.

8. A target for ultraviolet light generation according to claim 7, wherein the rare-earth-containing aluminum garnet polycrystal is LuAG, while the activator is at least one of Sc, La, and Bi.

9. A target for ultraviolet light generation according to claim 7, wherein the rare-earth-containing aluminum garnet polycrystal is YAG, while the activator is at least one of Sc and La.

10. A target for ultraviolet light generation according to claim 7, wherein the polycrystalline film has a thickness of at least 0.1 µm but not more than 10 µm.

11. A target for ultraviolet light generation according to claim 7, wherein the substrate is constituted by sapphire, silica, or rock crystal.

12. An electron-beam-excited ultraviolet light source comprising:
   the target for ultraviolet light generation according to claim 7; and
   an electron source providing the target with the electron beam.

13. A method for manufacturing a target for ultraviolet light generation, the method comprising:
   a first step of vapor-depositing an activator and an oxide containing Lu and Si on a substrate adapted to transmit ultraviolet light therethrough, so as to form a film; and
   a second step of turning the film into a polycrystal by heat treatment.

14. A method for manufacturing a target for ultraviolet light generation according to claim 13, wherein the surroundings of the film are at an atmospheric pressure during the heat treatment in the second step.

15. A method for manufacturing a target for ultraviolet light generation according to claim 13, wherein the film has a thickness of at least 0.1 µm but not more than 10 µm after the heat treatment in the second step.

16. A method for manufacturing a target for ultraviolet light generation, the method comprising:
   a first step of vapor-depositing an activator having an ultraviolet light emission peak wavelength of 300 nm or shorter and a material for a rare-earth-containing aluminum garnet crystal, so as to form a film; and
   a second step of turning the film into a polycrystal by heat treatment.

17. A method for manufacturing a target for ultraviolet light generation according to claim 16, wherein the surroundings of the film are in a vacuum during the heat treatment in the second step.

18. A method for manufacturing a target for ultraviolet light generation according to claim 16, wherein the film has a thickness of at least 0.1 µm but not more than 10 µm after the heat treatment in the second step.

* * * * *

UNITED STATES PATENT AND TRADEMARK OFFICE
CERTIFICATE OF CORRECTION

| | | |
|---|---|---|
| PATENT NO. | : 9,240,313 B2 | Page 1 of 1 |
| APPLICATION NO. | : 14/437376 | |
| DATED | : January 19, 2016 | |
| INVENTOR(S) | : Yoshinori Honda et al. | |

It is certified that error appears in the above-identified patent and that said Letters Patent is hereby corrected as shown below:

In Item (72) "Inventors", on the title page of the above-identified patent,

Change third inventor's city from "Hamamatus" to --Hamamatsu--

Signed and Sealed this
Twenty-sixth Day of April, 2016

Michelle K. Lee
*Director of the United States Patent and Trademark Office*